(12) United States Patent
Nahas et al.

(10) Patent No.: US 7,206,223 B1
(45) Date of Patent: Apr. 17, 2007

(54) MRAM MEMORY WITH RESIDUAL WRITE FIELD RESET

(75) Inventors: Joseph J. Nahas, Austin, TX (US); Thomas W. Andre, Austin, TX (US); Chitra K. Subramanian, Austin, TX (US); Nicholas David Rizzo, Gilbert, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 11/297,203

(22) Filed: Dec. 7, 2005

(51) Int. Cl.
*G11C 11/00* (2006.01)

(52) U.S. Cl. ........................ 365/158; 365/171
(58) Field of Classification Search ................ 365/158, 365/171, 189.01
See application file for complete search history.

(56) References Cited

U.S. PATENT DOCUMENTS

| 5,168,395 | A | 12/1992 | Klaassen et al. | |
|---|---|---|---|---|
| 6,359,805 | B1 * | 3/2002 | Hidaka | 365/171 |
| 6,363,000 | B2 * | 3/2002 | Perner et al. | 365/66 |
| 6,545,906 | B1 | 4/2003 | Savtchenko et al. | |
| 6,711,052 | B2 | 3/2004 | Subramanian et al. | |
| 6,842,365 | B1 | 1/2005 | Nahas et al. | |
| 6,859,388 | B1 | 2/2005 | Nahas et al. | |
| 6,956,763 | B2 * | 10/2005 | Akerman et al. | 365/158 |
| 2002/0044481 | A1 | 4/2002 | Hidaka | |
| 2002/0080646 | A1 | 6/2002 | Hidaka | |

* cited by examiner

Primary Examiner—Vu A. Le
(74) Attorney, Agent, or Firm—Robert L. King; Susan C. Hill

(57) ABSTRACT

A magnetoresistive random access memory (MRAM) (900) that is susceptible to a residual magnetic field is compensated during a write operation. A first magnetic field (208) is applied to a memory cell during a first time period, the first magnetic field having a first direction (y) and a first magnitude. A second magnetic field (212) is applied to the memory cell during a second time period and having a second direction (x) and a second magnitude. A third magnetic field (702) is applied to the memory cell during a third time period, wherein the third time period overlaps at least a portion of the second time period, the third magnetic field having a third direction (-y) which is approximately opposite to the first direction of the first magnetic field. Currents are selectively applied through conductors in the memory cell to apply the three magnetic fields.

20 Claims, 12 Drawing Sheets

MRAM MEMORY WITH RESIDUAL WRITE FIELD RESET

CROSS REFERENCE TO RELATED APPLICATION

This patent is related to a copending U.S. patent application Ser. No. 11/297,202 entitled "MRAM With A Write Driver And Method Therefor" filed of even date and assigned to the assignee of record herein.

FIELD OF THE INVENTION

This invention relates to Magnetoresistive Random Access Memories (MRAMs), and more particularly to architectures for MRAMs.

BACKGROUND OF THE INVENTION

Non-volatile memory devices, such as FLASH memories, are extremely important components in electronic systems. FLASH is a major non-volatile memory device in use today. Disadvantages of FLASH memory include high voltage requirements and slow program and erase times. Also, FLASH memory has a poor write endurance of $10^4$–$10^6$ cycles before memory failure. In addition, to maintain reasonable data retention, the scaling of the gate oxide is restricted by the tunneling barrier seen by the electrons. Hence, FLASH memory is limited in the dimensions to which it can be scaled.

To overcome these shortcomings, magnetic memory devices are being evaluated. One such device is magnetoresistive RAM (hereinafter referred to as "MRAM"). To be commercially practical, however, MRAM must have comparable memory density to current memory technologies, be scalable for future generations, operate at low voltages, have low power consumption, and have competitive read/write speeds.

For an MRAM device, the stability of the nonvolatile memory state, the repeatability of the read/write cycles, and the memory element-to-element switching field uniformity are three of the most important aspects of its design characteristics. A memory state in MRAM is not maintained by power, but rather by the direction of a magnetic moment vector. Storing data is accomplished by applying magnetic fields and causing a magnetic material in a MRAM device to be magnetized into either of two possible memory states. Recalling data is accomplished by sensing the resistive differences in the MRAM device between the two states. The magnetic fields for writing are created by passing currents through strip lines external to the magnetic structure or through the magnetic structures themselves.

As the lateral dimension of an MRAM device decreases, three problems occur. First, the switching field increases for a given shape and film thickness, requiring a larger magnetic field to switch. Second, the total switching volume is reduced so that the energy barrier for reversal decreases. The energy barrier refers to the amount of energy needed to switch the magnetic moment vector from one state to the other. The energy barrier determines the data retention and the error rate of the MRAM device from unintended reversals which can occur due to thermofluctuations (superparamagnetism) if the barrier is too small. A major problem with having a small energy barrier is that it becomes extremely difficult to selectively switch one MRAM device in an array. Selectability allows switching without inadvertently switching other MRAM devices. It is important to control the current flowing during a write operation in the array to avoid undesired current surges or spikes during transistor switching.

Finally, because the switching field is controlled by the shape of the magnetic tunnel junction, the switching field becomes more sensitive to shape variations as the MRAM device decreases in size. With photolithography scaling becoming more difficult at smaller dimensions, MRAM devices will have difficulty maintaining tight switching distributions. In any memory type, including MRAMs, there is a continuing desire to reduce the memory size and increase performance. One important aspect of performance is the speed with which the memory is read and written. Speed limitations include such things as the performance of the bit cell and the capacitance of the lines running through the array. A variety of techniques have been developed to improve these characteristics. For example, memory arrays have commonly been divided into subarrays so that no single line is excessively capacitive. This can also reduce power consumption. It is important in memories to efficiently switch the write circuitry to allow the write cycle speed to approximate the read cycle speed. The inability of a FLASH to accomplish this objective is a major disadvantage of FLASH.

The promise of MRAMs is, however, that of a memory with universal characteristics, i.e., a memory that can be both high speed and non-volatile. Thus, the need for improvements in speed and memory area efficiency continue. Thus, there is need for further improvements in architecture for MRAMs.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the following drawings.

DETAILED DESCRIPTION OF THE PREFERRED EMBODIMENT

A known toggle MRAM is illustrated by Savtchenko et al. in U.S. Pat. No. 6,545,906 and functions to provide stored information in a memory cell by selectively positioning magnetic fields associated with current conducted by two perpendicular conductors. Each bit of an MRAM has a magnetic tunnel junction (MTJ) which is composed of a composite of conductive layers separated by a single insulator. Each of the conductive layers has a magnetization direction. The resistance of a memory bit is reduced when the magnetization of the conductive layers adjacent to the insulator are in a same direction. Conversely, the resistance of a memory bit is increased when the magnetization of the conductive layers adjacent to the insulator are in an opposite direction.

In order to enhance the applied magnetic field from current flowing through the two orthogonal conductors, each of the conductors has three of its outward facing surfaces lined with a ferromagnetic cladding material such as NiFe to focus the resulting magnetic field towards an MTJ between the two conductors. The cladding material is absent from the surface of the conductors that faces the MTJ. The cladding material enhances the effective switching magnetic field generated for a given magnitude of current in the conductors. However, the cladding material may contain some defects that cause residual magnetic fields to exist once a magnetic field has been applied and removed. These defects are relatively uncommon in a large number of memory bits and therefore hard to detect. Also, due to the presence of several layers of magnetic materials in the MTJ, defects in any of these layers may also contribute to the existence of residual magnetic fields in an MRAM bit. Further, stray particles of magnetic materials that are present as defects generated during the fabrication process of an MTJ may also lead to the presence of residual magnetic fields after activation from externally applied fields. The residual magnetic fields may impede the proper writing of an MRAM cell as will be shown below. Compensation for the residual magnetic fields in an MRAM will be described herein.

Figure 1:
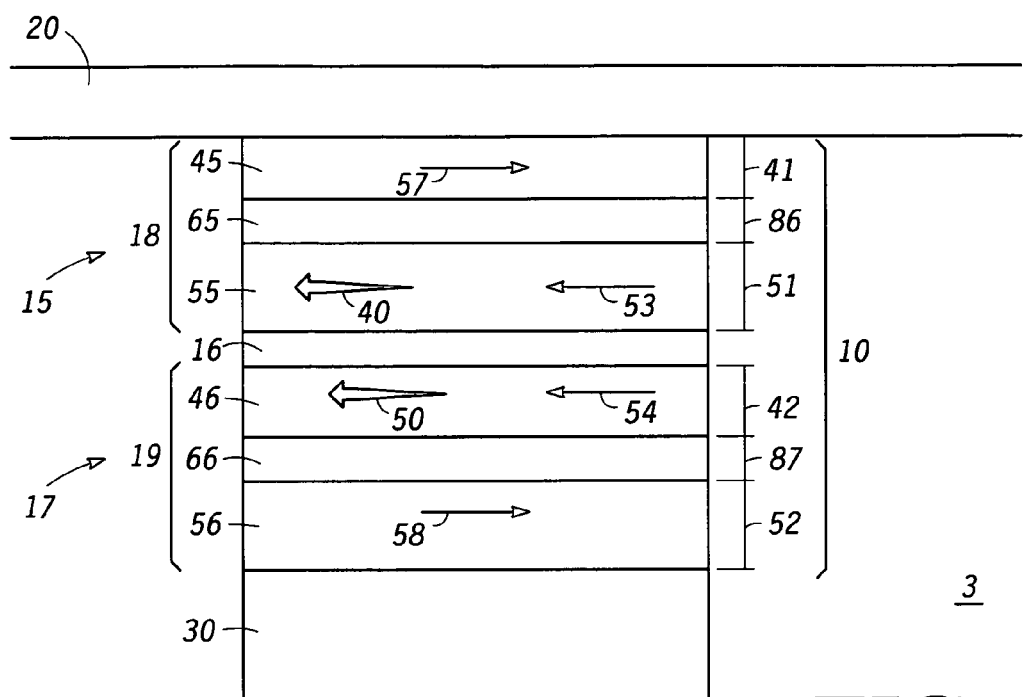
FIG. 1 illustrates a simplified sectional view of a known magnetoresistive random access memory device.

Turn now to FIG. 1, which illustrates a simplified sectional view of an MRAM array 3 in accordance with the present invention. In this illustration, only a single MRAM device 10 is shown, but it will be understood that MRAM array 3 consists of a number of MRAM devices such as MRAM device 10 and we are showing only one such device for simplicity in describing the writing method.

MRAM device 10 is sandwiched between a word line 20 and a bit line 30. Word line 20 and bit line 30 include conductive material such that a current can be passed through each. In this illustration, word line 20 is positioned on top of MRAM device 10 and bit line 30 is positioned on the bottom of MRAM device 10 and is directed at a ninety degree angle to word line 20 (See FIG. 2).

MRAM device 10 includes a first magnetic region 15, a tunneling barrier 16, and a second magnetic region 17, wherein tunneling barrier 16 is sandwiched between first magnetic region 15 and second magnetic region 17. In a preferred form, magnetic region 15 includes a tri-layer structure 18, which has an anti-ferromagnetic coupling spacer layer 65 sandwiched between two ferromagnetic layers 45 and 55. Anti-ferromagnetic coupling spacer layer 65 has a thickness 86 and ferromagnetic layers 45 and 55 have thicknesses 41 and 51, respectively. Further, magnetic region 17 has a tri-layer structure 19, which has an anti-ferromagnetic coupling spacer layer 66 sandwiched between two ferromagnetic layers 46 and 56. Anti-ferromagnetic coupling spacer layer 66 has a thickness 87 and ferromagnetic layers 46 and 56 have thicknesses 42 and 52, respectively.

Generally, anti-ferromagnetic coupling spacer layers 65 and 66 include at least one of the elements Ru, Os, Re, Cr, Rh, Cu, or combinations thereof. Further, ferromagnetic layers 45, 55, 46, and 56 include at least one of elements Ni, Fe, Mn, Co, or combinations thereof. Also, it will be understood that magnetic regions 15 and 17 can include synthetic anti-ferromagnetic layer material structures other than tri-layer structures and the use of tri-layer structures in this embodiment is for illustrative purposes only. For example, one such synthetic anti-ferromagnetic layer material structure could include a five-layer stack of a ferromagnetic layer/anti-ferromagnetic coupling spacer layer/ferromagnetic layer/anti-ferromagnetic coupling spacer layer/ferromagnetic layer structure.

Ferromagnetic layers 45 and 55 each have a magnetic moment vector 57 and 53, respectively, that are usually held anti-parallel by coupling of the anti-ferromagnetic coupling spacer layer 65. Ferromagnetic layers 46 and 56 each have a magnetic moment vector 54 and 58, respectively, that are usually held anti-parallel by coupling of the anti-ferromagnetic coupling spacer layer 66. Also, magnetic region 15 has a resultant magnetic moment vector 40 and magnetic region 17 has a resultant magnetic moment vector 50. Resultant magnetic moment vectors 40 and 50 are oriented along an anisotropy easy-axis in a direction that is at an angle, preferably forty-five degrees, from word line 20 and bit line 30 (See FIG. 2). Further, magnetic region 15 is a free ferromagnetic region, meaning that resultant magnetic moment vector 40 is free to rotate in the presence of an applied magnetic field. Magnetic region 17 is a pinned ferromagnetic region, meaning that resultant magnetic moment vector 50 is not free to rotate in the presence of a moderate applied magnetic field and is used as the reference layer.

While anti-ferromagnetic coupling layers are illustrated between the two ferromagnetic layers in each tri-layer structure 18, it will be understood that the ferromagnetic layers could be anti-ferromagnetically coupled through other means, such as magnetostatic fields or other features. For example, when the aspect ratio of a cell is reduced to five or less, the ferromagnetic layers are anti-parallel coupled from magnetostatic flux closure.

In the preferred embodiment, MRAM device 10 has tri-layer structures, such as tri-layer structure 18, that have a length/width ratio in a range of one to five for a non-circular plan. However, we illustrate a plan that is circular (See FIG. 2). However, it will be understood that MRAM device 10 can have other shapes, such as square, elliptical, rectangular, or diamond, but is illustrated as being circular for simplicity.

Further, during fabrication of MRAM array 3, each succeeding layer (i.e. 30, 55, 65, etc.) is deposited or otherwise formed in sequence and each MRAM device 10 may be defined by selective deposition, photolithography processing, etching, etc. in any of the techniques known in the semiconductor industry. During deposition of at least the ferromagnetic layers 45 and 55, a magnetic field is provided to set a preferred easy magnetic axis for this pair (induced anisotropy). The provided magnetic field creates a preferred anisotropy axis for magnetic moment vectors 53 and 57. The preferred axis is chosen to be at a forty-five degree angle between word line 20 and bit line 30, as will be discussed presently.

Figure 2:
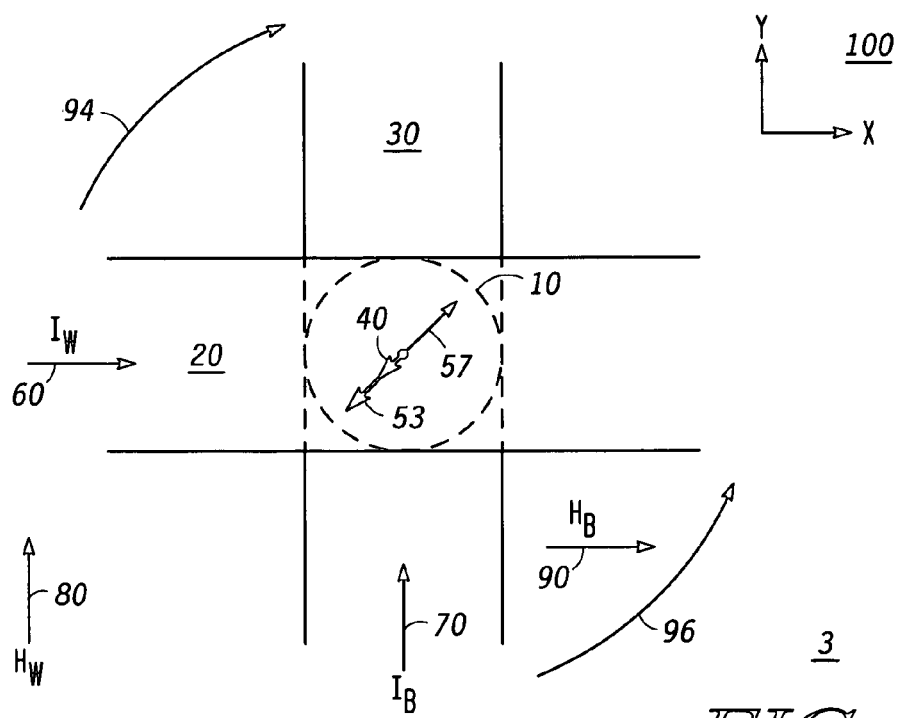
FIG. 2 illustrates a simplified plan view of a known magnetoresistive random access memory device with word and bit lines.

FIG. 2 illustrates a simplified plan view of a MRAM array 3 in accordance with the present invention. To simplify the description of MRAM device 10, all directions will be referenced to an x- and y-coordinate system 100 as shown and to a clockwise rotation direction 94 and a counter-clockwise rotation direction 96. To further simplify the description, it is again assumed that N is equal to two so that MRAM device 10 includes one tri-layer structure in region 15 with magnetic moment vectors 53 and 57, as well as resultant magnetic moment vector 40. Also, only the magnetic moment vectors of region 15 are illustrated since they will be switched.

To illustrate how the writing methods work, it is assumed that a preferred anisotropy axis for magnetic moment vectors 53 and 57 is directed at a forty-five degree angle relative to the negative x- and negative y-directions and at a forty-five degree angle relative to the positive x- and positive y-directions. As an example, FIG. 2 shows that magnetic moment vector 53 is directed at a forty-five degree angle relative to the negative x- and negative y-directions. Since magnetic moment vector 57 is generally oriented anti-parallel to magnetic moment vector 53, it is directed at a forty-five degree angle relative to the positive x- and positive y-directions. This initial orientation will be used to show examples of the writing methods, as will be discussed presently.

In the preferred embodiment, a word current 60 is defined as being positive if flowing in a positive x-direction and a bit line current 70 is defined as being positive if flowing in a positive y-direction. The purpose of word line 20 and bit line 30 is to create a magnetic field within MRAM device 10. A positive word current 60 will induce a circumferential word magnetic field, $H_W$ 80, and a positive bit line current 70 will induce a circumferential bit line magnetic field, $H_B$ 90. Since word line 20 is above MRAM device 10, in the plane of the element, $H_W$ 80 will be applied to MRAM device 10 in the positive y-direction for a positive word current 60. Similarly, since bit line 30 is below MRAM device 10, in the plane of the element, $H_B$ 90 will be applied to MRAM device 10 in the positive x-direction for a positive bit line current 70. It will be understood that the definitions for positive and negative current flow are arbitrary and are defined here for illustrative purposes. The effect of reversing the current flow is to change the direction of the magnetic field induced within MRAM device 10. The behavior of a current induced magnetic field is well known to those skilled in the art and will not be elaborated upon further here.

Figure 3:
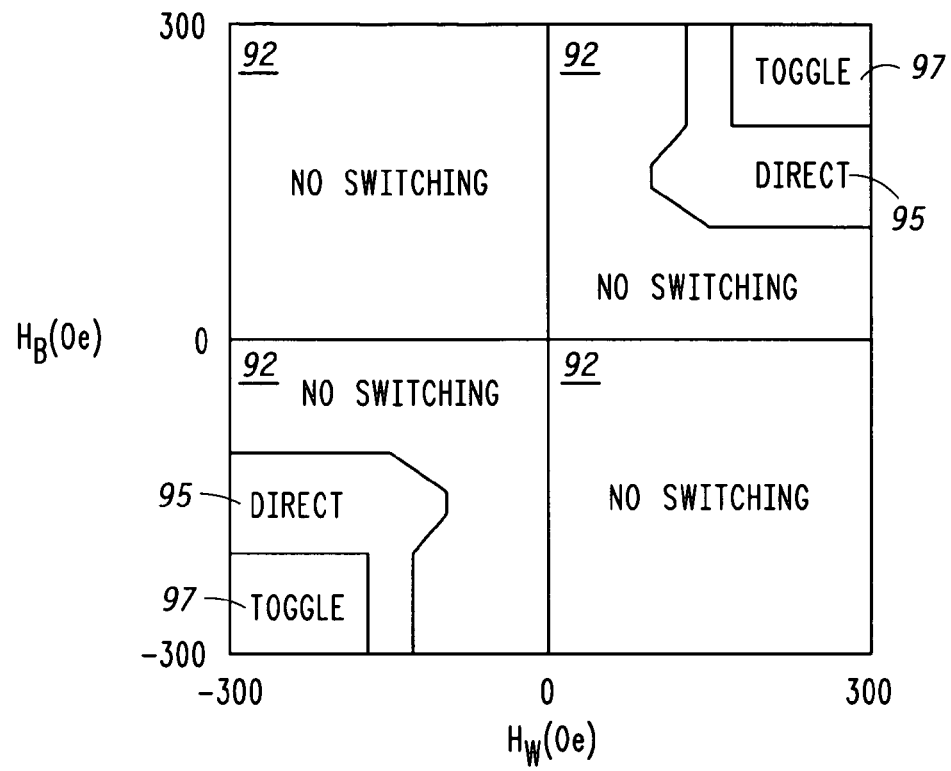
FIG. 3 illustrates in graphical form of a simulation of the magnetic field amplitude combinations that produce the direct or toggle write mode in an MRAM.
Figure 4:
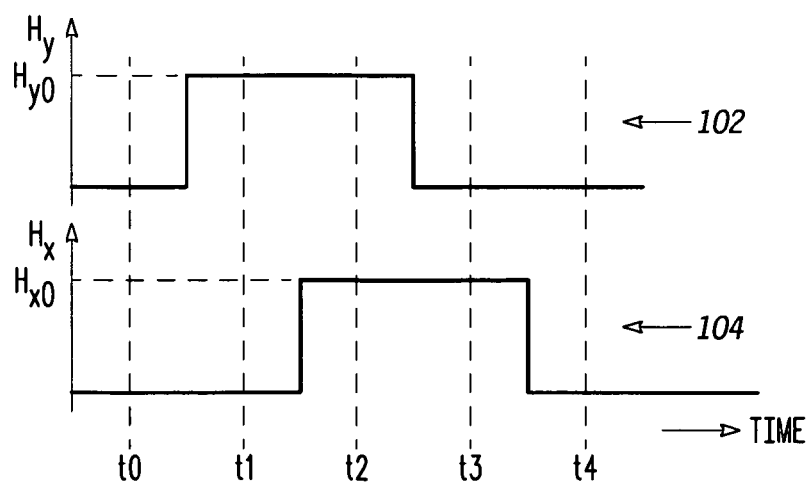
FIG. 4 illustrates a timing diagram of magnetic field phases in an MRAM as a function of time.

Turn now to FIG. 3 which illustrates the simulated switching behavior of a SAF tri-layer structure. The simulation consists of two single domain magnetic layers that have close to the same moment (a nearly balanced SAF) with an intrinsic anisotropy, are coupled anti-ferromagnetically, and whose magnetization dynamics are described by the Landau-Lifshitz equation. The x-axis is the word line magnetic field amplitude in Oersteds, and the y-axis is the bit line magnetic field amplitude in Oersteds. The magnetic fields are applied in a pulse sequence as shown in FIG. 4 that includes magnetic field $H_y$ resulting from word current 60 and magnetic field $H_x$ resulting from bit line current 70 as functions of time.

There are three regions of operation illustrated in FIG. 3. In a region 92 there is no switching. For MRAM operation in a region 95, the direct writing method is in effect. When using the direct writing method, there is no need to determine the initial state of the MRAM device because the state is only switched if the state being written is different from the state that is stored. The selection of the written state is determined by the direction of current in both word line 20 and bit line 30. For example, if a '1' is desired to be written, then the direction of current in both lines will be positive. If a '1' is already stored in the element and a '1' is being written, then the final state of the MRAM device will continue to be a '1'. Further, if a '0' is stored and a '1' is being written with positive currents, then the final state of the MRAM device will be a '1'. Similar results are obtained when writing a '0' by using negative currents in both the word and bit lines. Hence, either state can be programmed to the desired '1' or '0' with the appropriate polarity of current pulses, regardless of its initial state. Operation in region 95 is defined as "direct write mode".

For MRAM operation in a region 97, the toggle writing method is in effect. When using the toggle writing method, there is a need to determine the initial state of the MRAM device before writing because the state is switched every time the MRAM device is written to, regardless of the direction of the currents as long as the same polarity current pulses are chosen for both word line 20 and bit line 30. For example, if a '1' is initially stored then the state of the device will be switched to a '0' after one positive current pulse sequence is flowed through the word and bit lines. Repeating the positive current pulse sequence on the stored '0' state returns it to a '1'. Thus, to be able to write the memory element into the desired state, the initial state of MRAM device 10 must first be read and compared to the state to be written. The reading and comparing may require additional logic circuitry, including a buffer for storing information and a comparator for comparing memory states. A full current pulse sequence is only applied to MRAM device 10 if the stored state and the state to be written are different. One of the advantages of this method is that the power consumed is lowered because only the differing bits are switched. An additional advantage of using the toggle writing method is that only uni-polar voltages are required and, consequently, smaller transistor area can be used to drive the MRAM device. Throughout this disclosure, operation in region 97 will be defined as "toggle write mode".

Both writing methods involve supplying currents in word line 20 and bit line 30 such that magnetic moment vectors 53 and 57 can be oriented in one of two preferred directions as discussed previously. To fully elucidate the two switching modes, specific examples describing the time evolution of magnetic moment vectors 53, 57, and 40 are now given.

Illustrated in FIG. 4 is a timing diagram illustrating magnetic fields in two directions x and y and designated by 102 and 104, respectively. The timing diagram is representative of the fields used to switch an MTJ in a toggle MRAM. The magnetic fields permit the toggle MRAM to be written. The magnetic fields are generated by currents in the two orthogonal conductors, word line 20 and bit line 30 in FIG. 2. One of the conductors overlies the other with the MTJ in between the two conductors at the junction of the two conductors.

At time t0 the magnetic fields in both directions are zero. At time t1 the magnetic field in the Y direction is a finite value $H_{y0}$ while the magnetic field in the X direction is zero. At time t2 the magnetic field in the Y direction continues at $H_{y0}$ while the magnetic field in the X direction is at $H_{x0}$. At time t3 the magnetic field in the Y direction returns to zero while the magnetic field in the X direction continues at $H_{x0}$. At time t4 the magnetic field in both the Y direction and the X direction is at zero.

Figure 5:
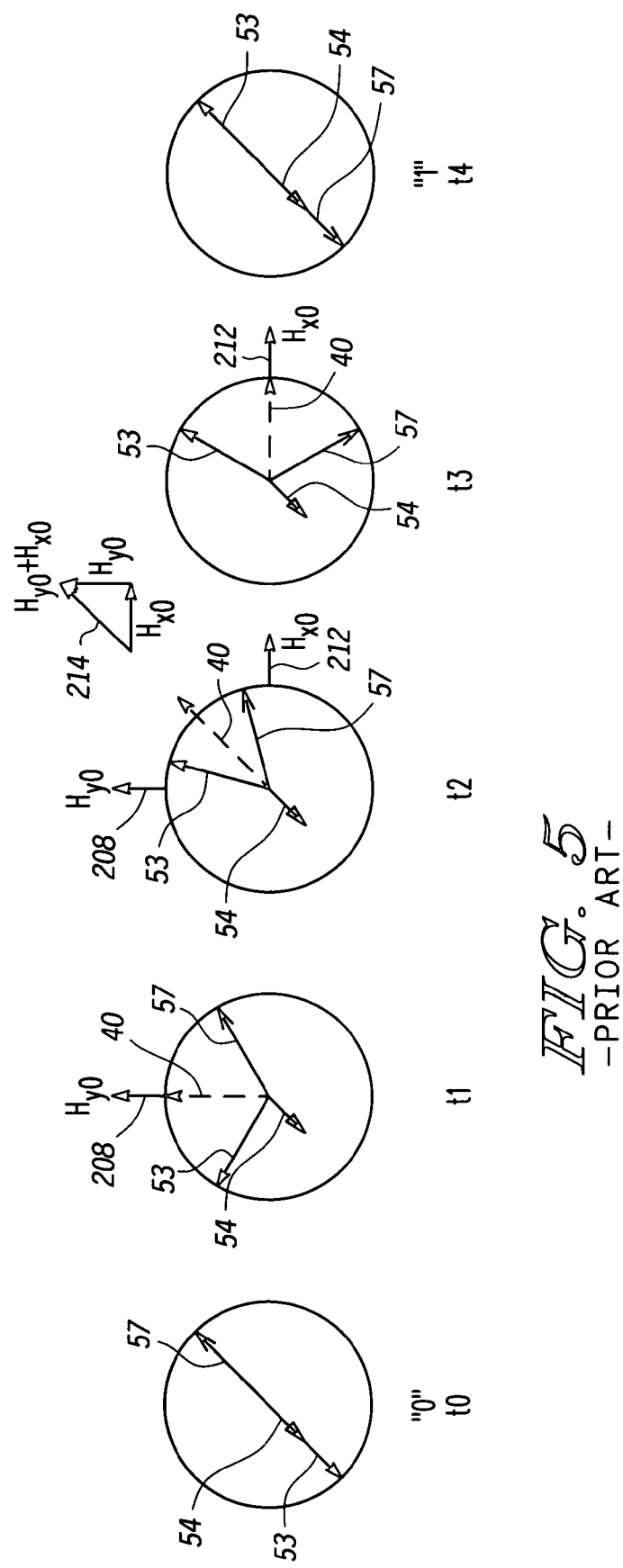
FIG. 5 illustrates rotating magnetic field vectors switching an MRAM memory bit from state zero to state one.

Illustrated in FIG. 5 are various magnetic states correlated to the timing of FIG. 4. The nomenclature that is used in FIG. 5 refers back to FIG. 1 and includes a fixed layer 46 with magnetic moment 54 which is below the tunnel junction of the MTJ, and a synthetic antiferromagnet (SAF) above the tunnel junction which includes, among other features, an upper layer 45 with magnetic moment 57 and a lower SAF layer 55 with magnetic moment vector 53. The magnetic moment vector 53 of the lower SAF layer 55 is just above the tunnel junction of the MTJ so that the magnetic moment vector 53 relative to the magnetic moment vector 54 of the fixed layer controls the resistance of the MTJ. When the magnetic moment vector 54 of the fixed layer and magnetic moment vector 53 are in the same direction, the resistance of the MTJ is in the low resistance state which is designated by the logic state "0". When the magnetic moment vector 54 and magnetic moment vector 53 are in the opposite direction, the resistance of the MTJ is in the high resistance state which is designated by the logic state "1". At time t0 the MTJ is in the "0" logic state. In this state magnetic moment vector 53 is in the same direction as magnetic moment vector 54. The upper SAF layer magnetic moment 57 is in the opposite direction of magnetic moment vector 53. This state represents a minimum energy state for the MTJ.

At time t1, magnetic field $H_{y0}$ 208 is applied to the MTJ in the y direction. The magnetic moment vectors 53 and 57 of the SAF layers rotate in a clockwise direction so that their net magnetic moment vector 40 aligns with the magnetic field $H_{y0}$. At time t2, both magnetic fields $H_{y0}$ 208 and $H_{x0}$ 212 are applied to the MTJ in the y and x direction respectively, resulting in a net magnetic field 214. The magnetic moment vectors 53 and 57 of the SAF layers again rotate in a clockwise direction so that their net magnetic moment vector 40 aligns with the net magnetic field 214.

Figure 6:
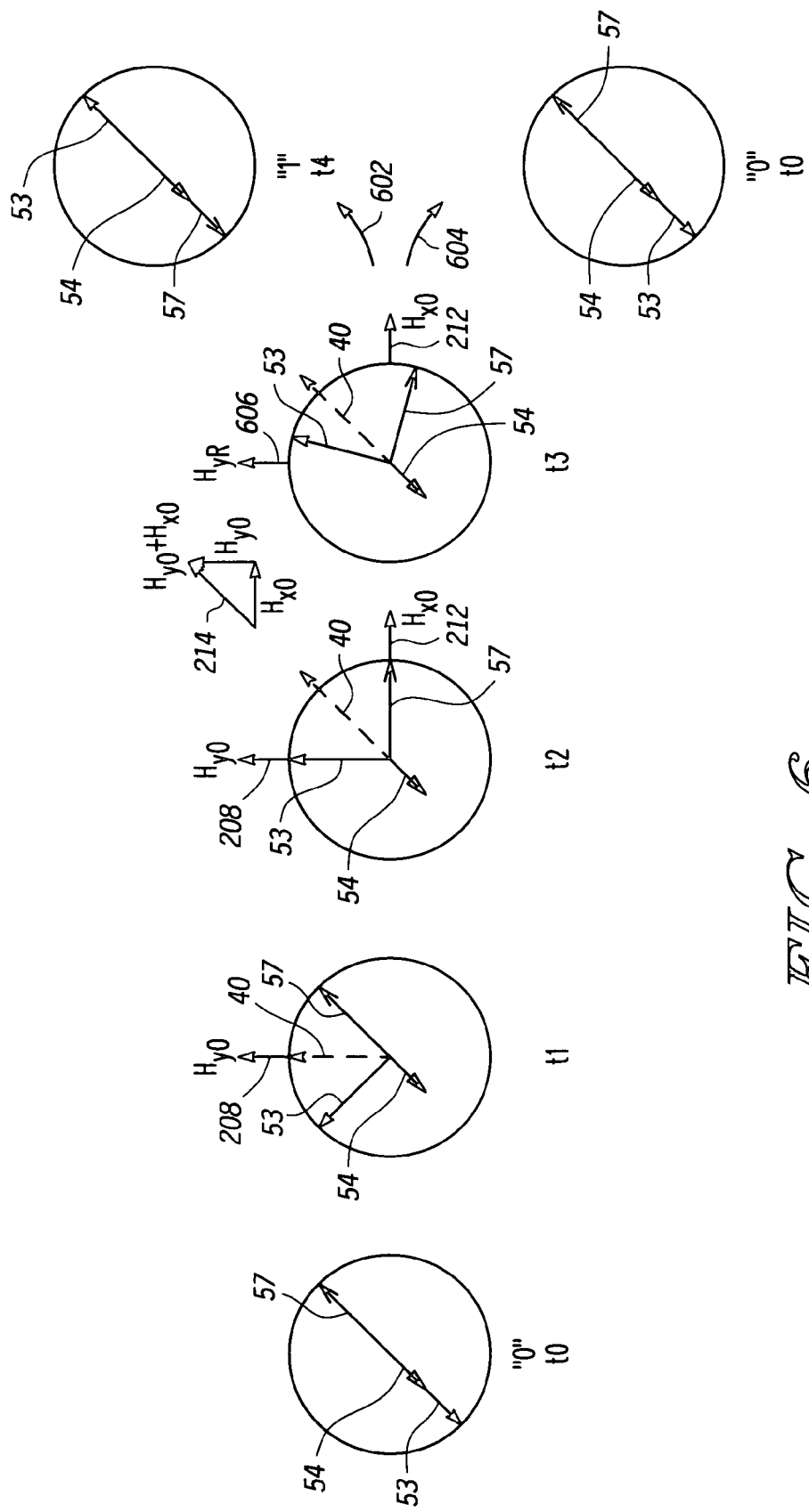
FIG. 6 illustrates the effect of having an anomalous residual magnetic field on switching operation of an MRAM bit.

Illustrated in FIG. 6 are various magnetic states in an MRAM bit cell that is exhibiting the presence of a residual magnetic field. For convenience of explanation, the same reference numbers used in FIG. 5 will again be used. Assume that an MRAM bit is initially programmed to a logic zero at time t0 and that the operation of the writing of the MRAM bit is the same as in connection with FIG. 5 through time t1 and t2.

At time t3, when the magnetic field $H_{y0}$ is removed a residual (remanent) magnetic field 606, $H_{yr}$, remains as a result of defects in the magnetic cladding layer surrounding word line 20. Remanent fields can also be generated by magnetic defect particles left over from processing. Magnetic defects may also exist in the bit which produce magnetization states that behave as if a remanent field is being applied. For simplicity hereafter, we describe the case where the remanent field $H_{yr}$ is generated by the magnetic cladding layer. Remanent field $H_{yr}$ rotates the net magnetic field at time t3 counterclockwise from its desired alignment with applied magnetic field $H_{x0}$. Therefore, the magnetic moment vectors 53 and 57 of the SAF layers rotate in a clockwise direction so that the net magnetic moment vector 40 aligns with the resultant magnetic field $H_{x0}$ 212 and $H_{yr}$ 606. Note that in the absence of the defect, the net magnetic moment vector 40 would have aligned to $H_{x0}$ 212. This difference in the rotation of the magnetic moment vectors 53 and 57 of the SAF layers creates a potentially erroneous write operation during time t4. At time t4 when the magnetic field $H_{x0}$ is removed, one of two operations, operation 602 or operation 604 may occur. If operation 602 occurs, magnetic moment vector 57 aligns with fixed magnetic moment 54. This operation 602 is desired and results in switching the memory bit from a logic zero to a logic one. If operation. 604 occurs, magnetic moment vector 53 aligns with fixed magnetic moment vector 54. This operation 604 is not desired and results in no switching of the memory bit from a logic zero state. While either of these operations 602 and 604 may result, it should be understood that the probability of operation 602 is much greater than operation 604. Some of the factors that determine operation 602 or operation 604 are the magnitude of the residual magnetic field $H_{yr}$ 606 and a thermal component in the form of thermal noise in the switching.

Figure 7:
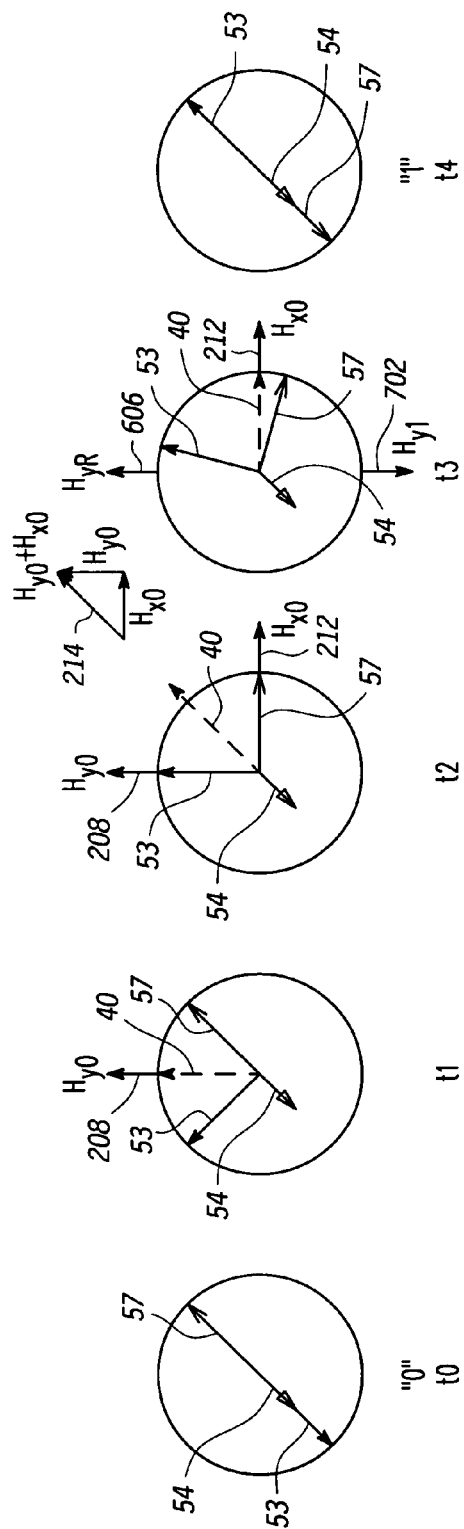
FIG. 7 illustrates compensation for the anomalous residual magnetic field of FIG. 6 in accordance with the present invention.

Illustrated in FIG. 7 is compensation for an anomalous residual magnetic field in an MRAM bit cell to ensure correct memory write operation. For convenience of explanation, the same reference numbers used in FIGS. 5 and 6 will again be used. Assume that an MRAM bit is initially programmed to a logic zero at time t0 and that the operation of the writing of the MRAM bit is the same as in connection with FIG. 5 through time t1 and t2.

At time t3, the magnetic field $H_{y0}$ is removed and an opposing magnetic field $H_{y1}$ is applied which compensates for the residual magnetic field 606, $H_{yr}$, resulting from defects in the cladding layer surrounding word line 20. Therefore, the applied magnetic fields rotate the net magnetic moment vector 40 at time t3 to align with applied magnetic field $H_{x0}$. Not only does the opposing magnetic field $H_{y1}$ cancel the residual magnetic field 606, $H_{yr}$, but in some cases it can actually eliminate $H_{yr}$ completely by driving the cladding back into a magnetization state where $H_{yr}$ is zero even with no field applied. In this case we can say that $H_{y1}$ has demagnetized the cladding. Note that in the absence of the defect, the net magnetic moment vector 40 would have rotated further clockwise toward a resultant of $H_{x0}$ 212 and $H_{y1}$ 54 moving the net magnetic moment vector 40 closer to the desired switched position.

At time t4 when the magnetic field $H_{x0}$ is removed, only one operation occurs. Alignment of SAF magnetic moment 57 with fixed magnetic moment 54 occurs. This is the desired operation and results in switching the memory bit from a logic zero state to a logic one. Thus we have accomplished a reliable write operation on both defective bits with residual magnetic fields as well as normal bits having no residual magnetic fields. To be effective, the magnitude of $H_{y1}$ should be a noticeable percentage of the expected maximum level of the residual magnetic field. In one form, the magnitude of $H_{y1}$ is implemented with a magnitude that is greater than $H_{yr}$. However, it should be well understood that if the magnitude of $H_{y1}$ does not have the full value of $H_{yr}$, significant reduction in the probability of erroneous write operation can still be obtained. Therefore, the application of a reverse magnetic field during time period t3 is used to offset the negative effects of residual magnetism.

Figure 8:
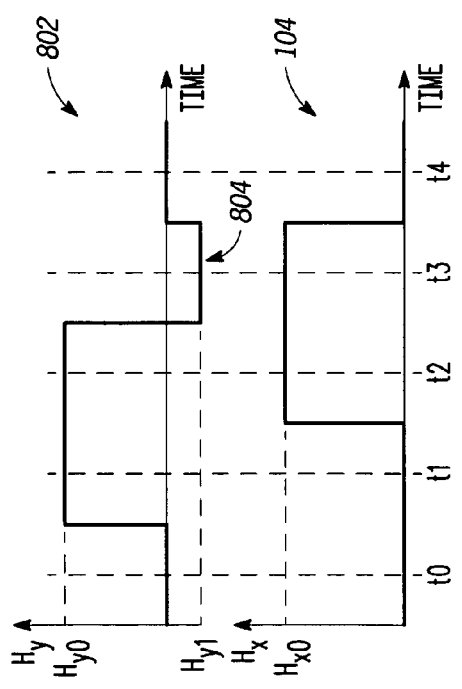
FIG. 8 illustrates a timing diagram of magnetic field phases in an MRAM in accordance with the present invention.

Illustrated in FIG. 8 is a timing diagram of magnetic field phases in an MRAM in accordance with the present invention. For purposes of explanation, the same magnetic field naming used previously will again be used in FIG. 8. The applied magnetic fields $H_y$ 802 and $H_x$ 104 are applied in the illustrated form as a function of time to write to a desired memory bit. At time t0 neither magnetic field is applied to the desired memory bit resulting in the magnetic fields illustrated in FIG. 7 for time t0. At time t1 only the magnetic field $H_y$ 802 is applied with a first magnitude of $H_{y0}$ resulting in the magnetic fields illustrated in FIG. 7 for time t1. At time t2 both magnetic fields $H_y$ 802 of the first magnitude of $H_{y0}$ and $H_x$ 104 of magnitude $H_{x0}$ are applied to the desired memory bit resulting in the magnetic fields illustrated in FIG. 7 for time t2. At time t3 both magnetic fields $H_y$ 802 of the third magnitude of $H_{y1}$ and $H_x$ 104 of the second magnitude $H_{x0}$ are applied to the desired memory bit resulting in the magnetic fields illustrated in FIG. 7 for time t3. It should be noted that portion 804 of the $H_y$ pulse is in the opposite the direction of the $H_y$ pulse at times t1 and t2 and has a magnitude $H_{y1}$. At time t4 all magnetic fields are removed resulting in the magnetic fields illustrated in FIG. 7 for time t4.

Note that although in FIG. 8 the word line field $H_y$ and bit line field $H_x$ are shown to be removed approximately simultaneously, it may be possible and even advantageous for $H_y$ to be removed before or after the removal of $H_x$. For example, if $H_{y1}$ succeeds in demagnetizing the cladding so that $H_{yr}$ is reduced to zero, then $H_{y1}$ is no longer needed and may be removed immediately, regardless of the state of $H_x$. If $H_{yr}$ remains finite even once $H_{y1}$ is applied, then it is advantageous to keep $H_{y1}$ applied at least until $H_x$ is removed, so that the net field in the y direction is ensured to be zero when $H_x$ is reduced to zero. In this case, delaying the $H_{y1}$ removal until after the $H_x$ removal may be advantageous, given the difficulty in ensuring exact synchronization of pulses at nanosecond time scales.

In the previous discussion above, we have focused primarily on using a bipolar field for the first pulse in the MRAM bit switching sequence. However, similar enhancements in switching reliability can be achieved by using a bipolar field for the second pulse as well. For example, if there is a cladding defect that produces a field $H_{xr}$ on the bit, then one can apply a negative field $H_{x1}$ after the positive field $H_{x0}$. The negative field $H_{x1}$ greatly increases the likelihood that the cladding will be demagnetized so that $H_{xr}$ is reduced to zero. A finite $H_{xr}$ is undesirable since it has the same effect as applying the field pulses in the wrong order. Instead of applying $H_y$, then $H_x$, then removing $H_y$, then removing $H_x$ as required for proper switching, a field in the x direction $H_{xr}$ is effectively applied first. If $H_{xr}$ is large enough, a programming error will occur. In a worst case scenario, both the first and second pulses will need to be bipolar as described above to ensure maximum switching reliability.

Figure 9:
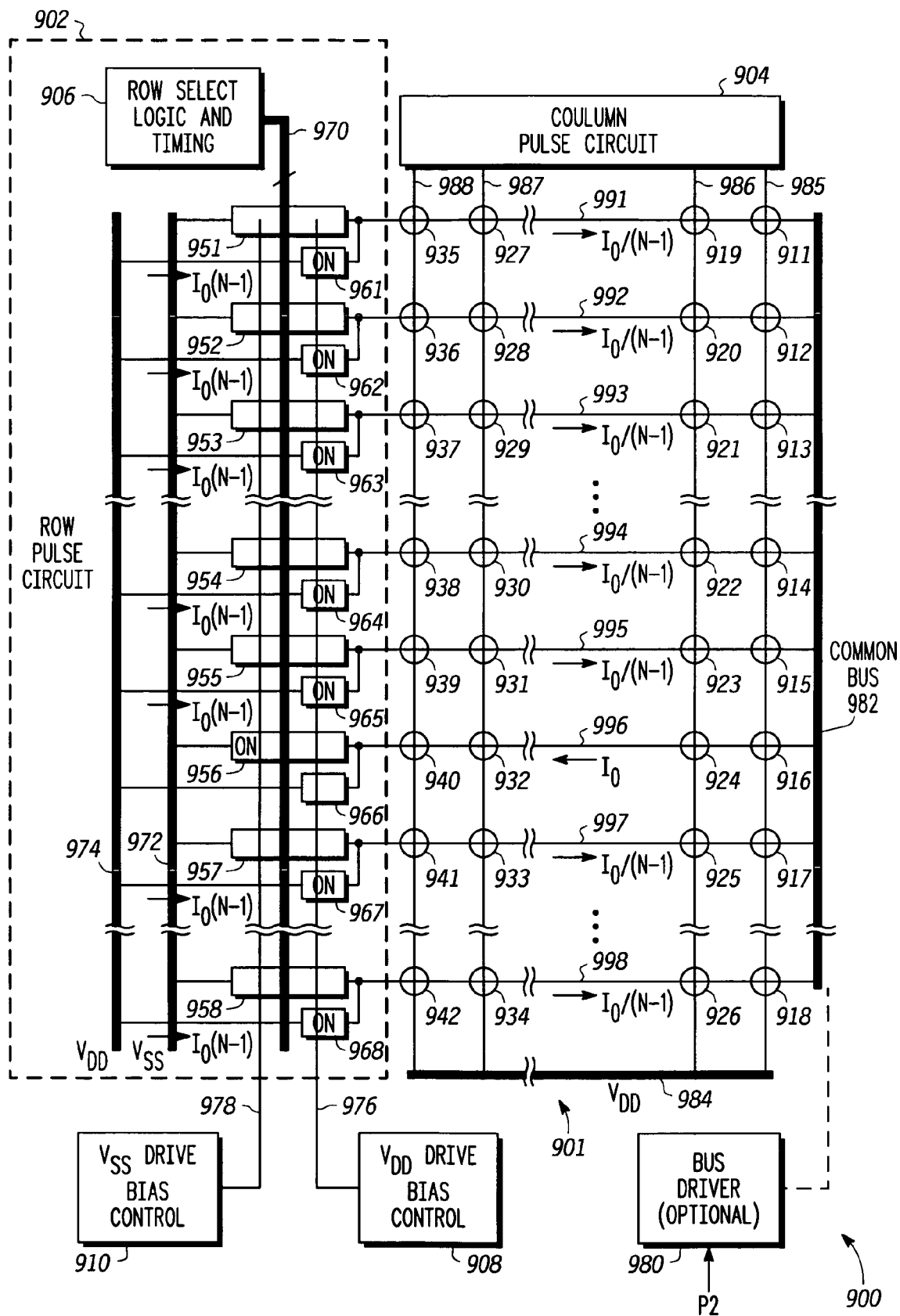
FIG. 9 illustrates a first phase of a write portion of one form of an MRAM architecture in accordance with the present invention.

Illustrated in FIG. 9 is an MRAM architecture 900 for a write operation of the memory. The MRAM architecture 900 has a column pulse circuit 904, a row select logic and timing circuit 906, a $V_{DD}$ drive bias control circuit 908 and a $V_{SS}$ drive bias control circuit 910. A plurality of memory cells 911 through 942 form a memory array 901. Each of memory cells 911–942 is formed at the intersection of a respective one of a plurality of column conductors 985, 986 . . . 987 and 988 and a respective one of a plurality of row conductors 991–997 and up to row conductor 998. Each of memory cells 911–942 is a magnetoresistive random access memory cell. Each column conductor functions as a write bit line and each row conductor functions as a write word line. It should be appreciated that any number of row conductors and column conductors may be implemented. Also, the total number of row conductors may or may not equal the total number of column conductors. Each of row conductors 991–998 is connected to a common bus 982 on one end and to both a respective one of drivers 961–968 and a respective one of drivers 951–958. Each of the column conductors 985–988 has a first end that is connected to the column pulse circuit 904 and has a second end that is connected to a $V_{DD}$ power bus 984. Each of drivers 951–958 is connected to a $V_{SS}$ power bus 972, and each of drivers 961–968 is connected to a $V_{DD}$ power bus 974. A bus driver circuit 980 is connected to the common bus 982 and is an optional feature of the architecture as will be described below. A control signal P2 is connected to the bus driver circuit 980. Collectively the row select logic and timing circuit 906, the $V_{DD}$ power bus 974, the $V_{SS}$ power bus 972, drivers 951–958 and drivers 961–968 form a row pulse circuit 902. In the illustrated form, each of drivers 961–965 and drivers 967 and 968 are "on" or enabled and provide a current labeled $I_0/(N-1)$ that flows through row conductors 991–995 and row conductors 997, 998 into the common bus 982. In the illustrated form "N" is the number of row conductors in the memory array. Driver 966 however is off or not enabled. Each of drivers 951–955 and drivers 957 through 958 are "off" or nonconductive and driver 956 is "on" or conductive. The drivers are turned on or off in response to the $V_{SS}$ drive bias control circuit 910 and the $V_{DD}$ drive bias control circuit 908 which are respectively connected by a bus 978 and a bus 976. As a result, a current $I_0$ flows in row conductor 996 away from the common bus 982 and into the $V_{SS}$ power bus 972 via driver 956 which is "on" or enabled.

The circuit operation of MRAM architecture 900 of FIG. 9 will now be described in connection with the timing illustrated in FIG. 8. Assume that a write operation to the bit at memory cell 924 will be described. At time t1, a magnetic field $H_y$ of magnitude $H_{y0}$ is present. The magnetic field $H_y$ of magnitude $H_{y0}$ is generated by flowing current through the write bit line row conductor 996. To generate the magnetic field $H_y$ of magnitude $H_{y0}$, currents of magnitude $I_0/(N-1)$ flow from the $V_{DD}$ power bus through the drivers 961–965 and 967, 968 and write word lines of row conductors 991–995, 997, 998 and into the common bus 982. The sum of all of these currents results in current of magnitude $I_0$ flowing through the write word line of row conductor 996 and through the driver 956 to the $V_{SS}$ power bus 972 producing magnetic field $H_y$ of magnitude $H_{y0}$ over the selected bit 924. To produce magnetic field $H_y$ of magnitude $H_{y0}$ over the selected bit 924, drivers 961–965 and 967, 968 and 956 are made conductive under the control of signals on bus 970 generated by the row select logic and timing circuit 906. Also, under the control of the same signals, drivers 951–955 and 957 and 958 are made nonconductive and turn off. The current, $I_0$, in conductive driver 956 is controlled by the bias voltage conducted via bus 978. This current is distributed from conductive drivers 961–965 and 967 and 968 by Common Bus 982. The bias voltage coupled to conductive drivers 961–965 and 967 and 968 via bus 976 is sufficient to not control the current but to distribute it evenly across the drivers as $I_0/(N-1)$. For example, if: (1) the $V_{SS}$ drive bias control circuit 910 is adjusted to control the voltage on bus 978 so conductive driver 956 supplies 10 mA; (2) the $V_{DD}$ drive bias control circuit 908 is adjusted to control the voltage on bus 976 so conductive drivers 961–965 and 967 and 968 have the voltage to supply 1 mA; and (3) N is 32, then the current $I_0$ would be 10 mA while the current in each of conductive drivers 961–965 and 967 and 968 would be 10 mA/(32−1) which is less than the 1 mA which conductive drivers 961–965 and 967 and 968 could supply with the given bias voltage on bus 976.

In addition, at time t2 a magnetic field $H_x$ of magnitude $H_{x0}$ is present. The magnetic field $H_x$ of magnitude $H_{x0}$ is generated by flowing current through the write bit line of column conductor 986 under the control of the column pulse circuit 904 from $V_{DD}$ power bus 984. In the illustrated form bidirectional current is allowed to flow on the write word lines (i.e. the row conductors) but not the write bit lines (i.e. the column conductors). However, it should be understood that in other implementations, bidirectional current may be allowed to flow on the write bit lines but not the write word lines in order to compensate for residual magnetic fields. Also, bidirectional current may be allowed to flow on both the write bit lines and the write word lines for the compensation of residual magnetic fields.

Figure 10:
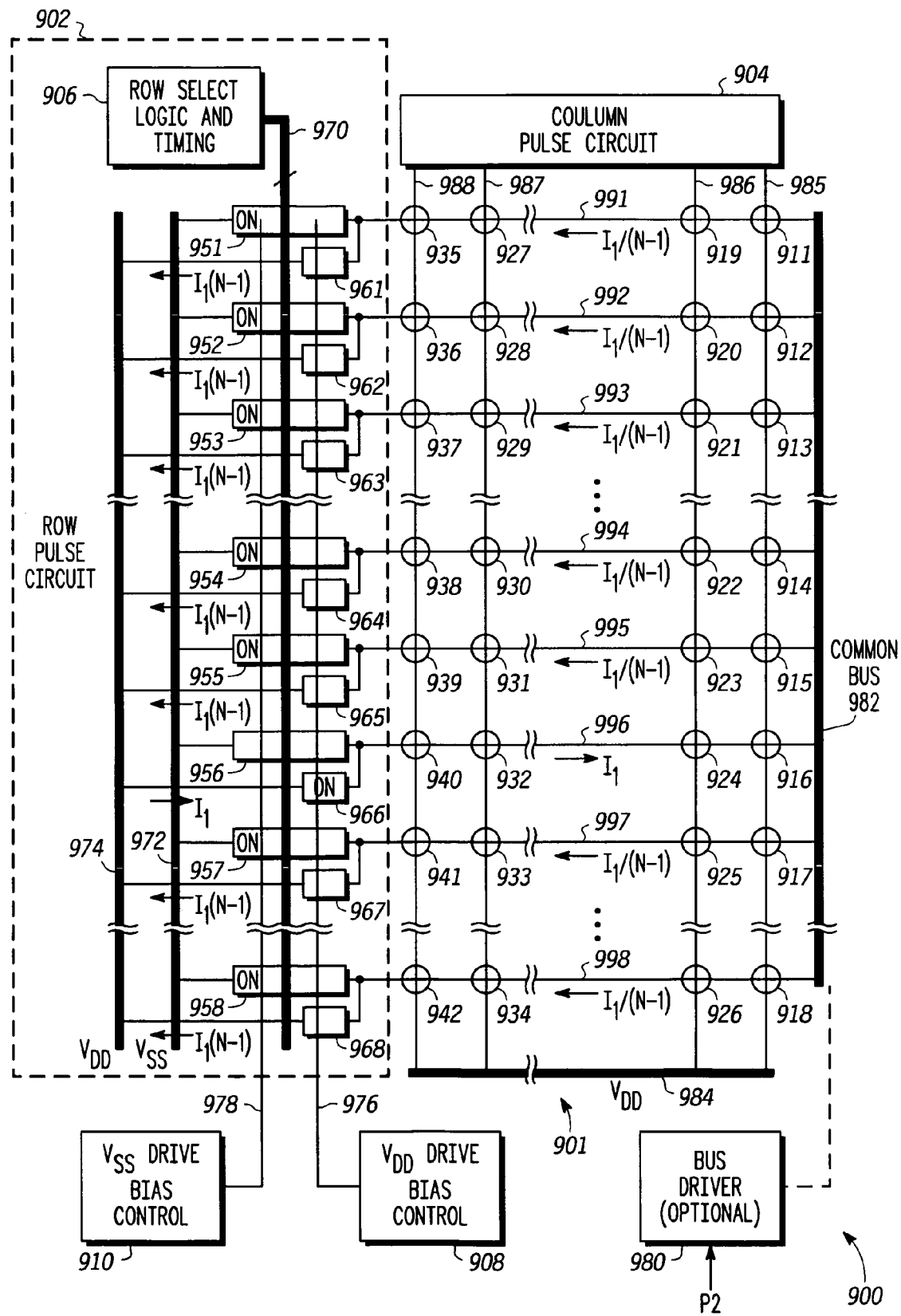
FIG. 10 illustrates another phase of a write portion of the MRAM architecture of FIG. 9 in accordance with the present invention.

Illustrated in FIG. 10 is the operation of MRAM architecture 900 at time t3 of FIG. 8. The same circuitry is illustrated in FIG. 10 as in FIG. 9 but the drivers are biased differently. At time t3, currents continue to flow through write bit line of column conductor 986 as described previously for time t2. In addition, magnetic field $H_y$ of magnitude $H_{y1}$ needs to be generated by flowing current through the write word line of row conductor 996. To do this, current of magnitude $I_1$ flows from $V_{DD}$ power bus 974 through driver 966 and the write word line of row conductor 996 and to the common bus 982. From common bus 982 the current I1 splits into currents of magnitude $I_1/(n-1)$ and distributes through the write word lines of row conductors 991–995, 997 and 998, drivers 951–955, 957 and 958 to the $V_{SS}$ power bus 972.

The magnitude of current $I_1$ is controlled by the bias voltage on the bus 976 through the conductive driver 966. The bias on bus 978 is such that conductive drivers 951–955, 957 and 958 split the $I_1$ current evenly as $I_1/(N-1)$. Current $I_1$ flows in a direction opposite to current $I_0$ and its magnitude generates field $H_{y1}$ in the direction opposite to $H_{y0}$ at the selected bit of memory cell 924. Using the same values as in the example above, the voltage on bus 976 controls the current in conductive driver 966 to 1 mA while the bias on bus 978 is adjusted to allow conductive drivers 951–955, 957, and 958 to carry as much as 10 mA. However, because of the circuit configuration, the 1 mA is split between the drivers so each carries 1 mA/(32−1) which is considerably less than the 10 mA limit as controlled by the bias on bus 978.

At time t4 of FIG. 8 the drivers 951–958 are turned off, and drivers 961–968 are turned on by the row select logic and timing circuit 906 to turn off all the write word line currents within the row conductors as required. Similarly, the column pulse circuit 904 turns off all of the write bit line currents within the column conductors as required. Thus architecture 900 implements the timing diagram of FIG. 8.

Figure 11:
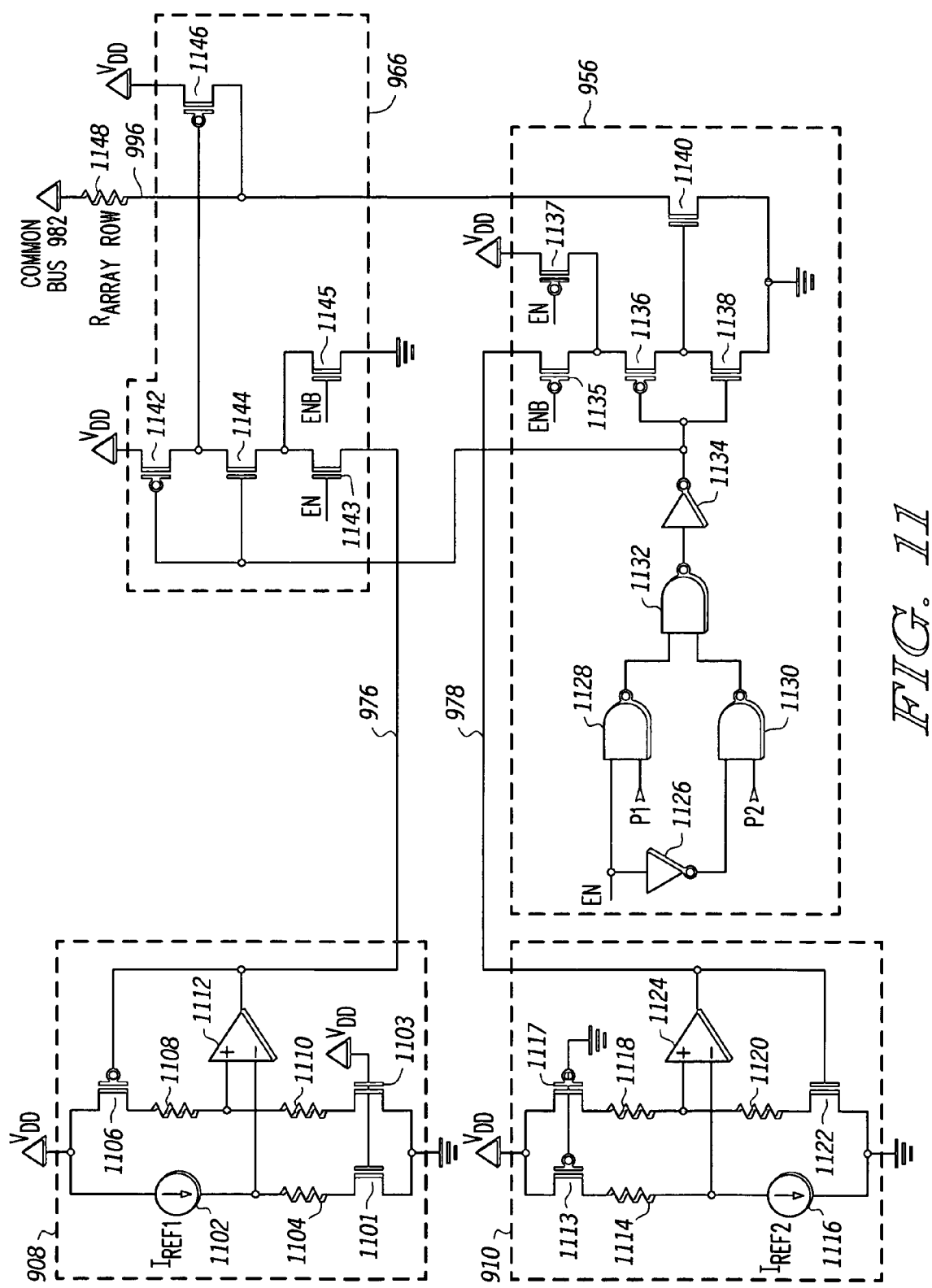
FIG. 11 illustrates in schematic form a write memory driver and associated circuitry for the MRAM architecture of FIGS. 9 and 10.

Illustrated in FIG. 11 is an exemplary schematic of a portion of the circuitry associated with architecture 900. For purposes of brevity, in addition to the $V_{SS}$ and $V_{DD}$ drive bias control circuits 908 and 910, only circuitry associated with drivers 966 and 956 is illustrated. It should be understood that circuitry analogous to drivers 966 and 956 is implemented for all of the drivers within MRAM architecture 900. In the $V_{DD}$ drive bias control circuit 908, a current source 1102 for providing a reference current $I_{REF\ 1}$ has a first terminal connected to a voltage terminal for receiving a supply voltage $V_{DD}$. A second terminal of current source 1102 is connected to both a first terminal of a resistor 1104 and to an inverting input or negative input of an operational amplifier 1112. A second terminal of resistor 1104 is connected to a drain of an N-channel transistor 1101. A source of N-channel transistor 1101 is connected to a ground reference terminal. A P-channel transistor 1106 has a source connected to the voltage terminal for receiving the supply voltage $V_{DD}$. A gate of transistor 1106 is connected to an output of operational amplifier 1112. A drain of transistor 1106 is connected to a first terminal of a resistor 1108. A second terminal of resistor 1108 is connected to a non-inverting or positive input of operational amplifier 1112 and to a first terminal of a resistor 1110. The output of operational amplifier 1112 provides a bias voltage to bus 976. A second terminal of resistor 1110 is connected to a drain of an N-channel transistor 1103. A source of N-channel transistor 1103 is connected to the ground reference terminal. A gate of N-channel transistor 1103 is connected to a gate of N-channel transistor 1101 and to a voltage terminal for receiving a supply voltage $V_{DD}$ to make transistors 1101 and 1103 conductive.

The $V_{SS}$ drive bias control circuit 910 similarly generates a voltage on bus 978. A P-channel transistor 1113 has a source connected to a voltage terminal for receiving supply voltage $V_{DD}$. A drain of P-channel transistor 1113 is connected to a first terminal of a resistor 1114. A second terminal of resistor 1114 is connected to both a negative or inverting input of an operational amplifier 1124 and to a first terminal of a current sink 1116. A second terminal of the current sink 1116 is connected to the ground reference terminal. A P-channel transistor 1117 has a source connected to the voltage terminal for receiving supply voltage $V_{DD}$, a gate connected to a gate of P-channel transistor 1113 and to the ground reference terminal. A drain of P-channel transistor 1117 is connected to a first terminal of a resistor 1118. A second terminal of resistor 1118 is connected to a first terminal of a resistor 1120 and to an inverting or negative input of operational amplifier 1124. A second terminal of resistor 1120 is connected to a drain of an N-channel transistor 1122. A source of N-channel transistor 1122 is connected to the ground reference terminal. A gate of N-channel transistor 1122 is connected to an output of the operational amplifier 1124 and to the bus 978 that functions as a bias voltage conductor.

Driver 956 has a NAND gate 1128 having a first input connected to a terminal for receiving an enable signal labeled "EN". A second input of NAND gate 1128 is connected to a terminal for receiving a control signal labeled "P1". An inverter 1126 has an input connected to the terminal for receiving the enable signal EN and an output connected to a first input of a NAND gate 1130. A second input of NAND gate 1130 is connected to a terminal for receiving a control signal labeled "P2". An output of NAND gate 1130 is connected to a first input of a NAND gate 1132. An output of NAND gate 1128 is connected to a second input of NAND gate 1132. An output of NAND gate 1132 is connected to an input of an inverter 1134. An output of inverter 1134 is connected to a gate of a P-channel transistor 1136 and to a gate of an N-channel transistor 1138. A P-channel transistor 1135 has a source connected to the bus 978 and a drain connected to a source of P-channel transistor 1136. A source of a P-channel transistor 1137 is connected to a voltage terminal for receiving the $V_{DD}$ supply voltage. A gate of P-channel transistor 1137 is connected to the enable signal EN, and a gate of P-channel transistor 1135 is connected to a complement of the enable signal EN labeled "ENB". A drain of P-channel transistor 1137 is connected to the drain of P-channel transistor 1135 and to a source of P-channel transistor 1136. The drain of P-channel transistor 1136 is connected to a drain of N-channel transistor 1138 and to a gate of an N-channel transistor 1140. A source of N-channel transistor 1138 and a source of N-channel transistor 1140 are both connected to the ground reference terminal.

Driver 966 has a P-channel transistor 1142 with a source connected to the power supply voltage terminal labeled $V_{DD}$, a gate connected to a gate of an N-channel transistor 1144 and to an output of inverter 1134, and a drain connected to a drain of an N-channel transistor 1144 and a gate of a P-channel transistor 1146. A source of N-channel transistor 1144 is connected to a drain of an N-channel transistor 1143 and to a drain of an N-channel transistor 1145. A gate of N-channel transistor 1143 is connected to the enable signal EN, and a gate of N-channel transistor 1145 is connected to the signal ENB. A source of N-channel transistor 1143 is connected to bus 976, and a source of N-channel transistor 1145 is connected to the ground reference terminal. The P-channel transistor 1146 has a source connected to the power supply voltage terminal labeled $V_{DD}$ and a drain connected to the drain of N-channel transistor 1140 and to the row conductor 996. The MRAM memory cells 940 and 932 through 924 and 916 are collectively represented as a resistance 1148 labeled "$R_{ARRAY\ ROW}$" The row conductor 996 terminates into the common bus 982.

In operation, current source 1102 provides a reference current to resistor 1104. Resistor 1104 and transistor 1101 are size ratioed to resistor 1110 and transistor 1103 so that the resistance of resistor 1104 in series with transistor 1101 is a multiple of the resistance of resistor 1110 in series with transistor 1103. Operational amplifier 1112 is used to bias transistor 1106 so that the voltage across resistor 1110 in series with transistor 1101 is the same as the voltage across resistor 1104 in series with transistor 1103. Therefore, resistor 1110 and transistor 1103 will conduct significantly more current than resistor 1104 and transistor 1101. The series resistance of resistor 1108 and 1110 is ratioed to the array row resistance 1148 $R_{ARRAY\ ROW}$ in the same ratio as the width of transistor 1140 is ratioed to the width of transistor 1106. Resistor 1108 functions to control an amount of drain voltage applied to transistor 1106. The bias voltage on bus 976 is used by driver 966. Similarly, drive bias control circuit 910 provides a bias voltage on bus 978 to driver 956.

Figure 12:
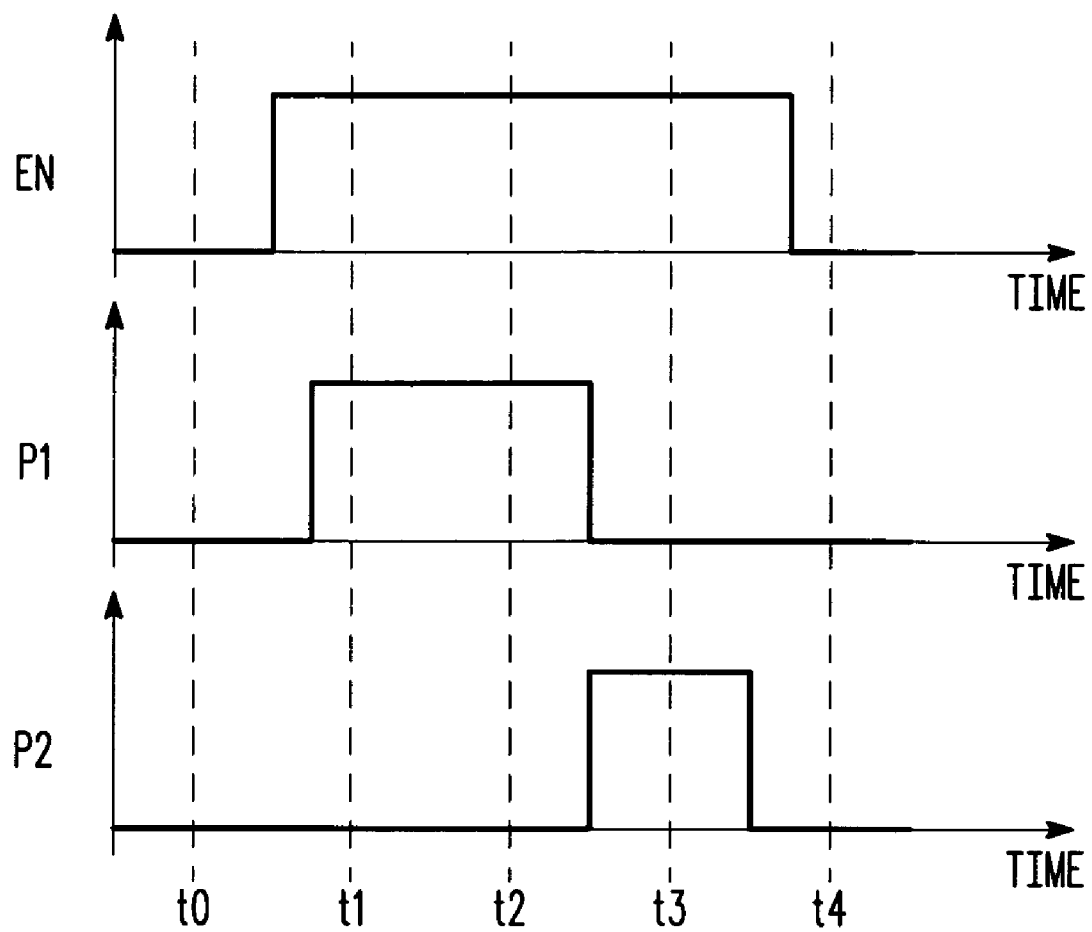
FIG. 12 illustrates a timing diagram of control signals associated with the write memory driver of FIG. 11.

Illustrated in FIG. 12 is an exemplary timing control for drivers 966 and 956. At time t0 control signals P1, P2 and EN are inactive. As a result, transistors 1144 and 1145 are conductive while transistors 1142 and 1143 are not conductive so that transistor 1146 is conductive. This is the same condition as drivers 961 to 965, 967, and 968. But transistors 1138 and 1137 are conductive while transistors 1135 and 1136 are not conductive so that transistor 1140 is not conductive. This is the same condition as drivers 951 to 955, 957, and 958. Since no driver connected to the ground terminal is conductive, no current is flowing in any of drivers 961 to 968 and 951 to 958.

At times t1 and t2, control signal P1 is active, P2 is inactive and EN is active only for the selected drivers, 956 and 966, attached to the selected write line. As a result, transistors 1135 and 1136 are conductive while transistors 1137 and 1138 are not conductive so the gate of transistor 1140 is connected to bus 978 and transistor 1140 is conductive in selected driver 956. But transistors 1142 and 1143 are conductive while transistors 1144 and 1145 are not conductive. As a result the gate of transistor 1146 is connected to $V_{DD}$ making transistor 1146 non-conductive in the selected driver 966. On the other hand, transistor 1146 is conductive and transistor 1140 is non-conductive in the unselected drivers. The bias voltage on bus 978 as applied to transistor 1140 controls the current in selected row conductor 996 to magnitude $I_0$ while transistor 1146 in the unselected drivers 961 to 965, 967, and 968 connects the common bus 982 to $V_{DD}$. Optionally, the bus driver circuit 980 connected to the common bus 982 places a $V_{DD}$ potential on the common bus 982. In one form the bus driver circuit 980 is composed of an inverter circuit (not shown) whose input is connected to the control signal P2 and whose output drives the common bus 982. When control signal P2 is inactive, the bus driver circuit 980 places $V_{DD}$ on the common bus 982, and when control signal P2 is active the bus driver circuit 980 drives $V_{SS}$ on the common bus 982. This voltage results in a current of predetermined magnitude $I_0$ controlled by the bias voltage of bus 978 flowing through the selected write bit line row conductor and no current flows in the unselected write bit lines.

At time t3 control signal P2 is active, P1 is inactive and EN is active only for the selected drivers 956 and 966, attached to the selected write line. As a result, transistors 1143, 1144, 1135, and 1138 are conductive and transistors 1142, 1144, 1137, and 1136 are non-conductive in the selected drivers 956 and 966. Transistors 1142, 1145, 1136 and 1137 are conductive and transistors 1143, 1144, 1135 and 1138 are non-conductive in the unselected drivers. The bias voltage on bus 976 is applied to the gate of transistor 1146 in the selected driver 966, making it conductive with current of predetermined magnitude $I_1$ which flows through row conductor 996. Common bus 982 is connected to the ground terminal through transistor 1140 in each of the unselected drivers 951 to 955, 957 and 958. Optionally, the bus driver circuit 980 connected to the common bus 982 places a ground potential on the common bus 982. This biasing results in a current I1 of predetermined magnitude controlled by the bias voltage on bus 976 to flow through the selected write bit line row conductor in a direction opposite to the current flowing at time t1.

At time t4 control signals P1, P2 and EN are again inactive. As a result, the transistor 1146 is conductive in drivers 961 to 968, but transistor 1140 is not conductive in drivers 951 to 958. No current therefore flows in either of the two drivers that are respectively attached to both selected and unselected write bit line row conductors.

Figure 13:
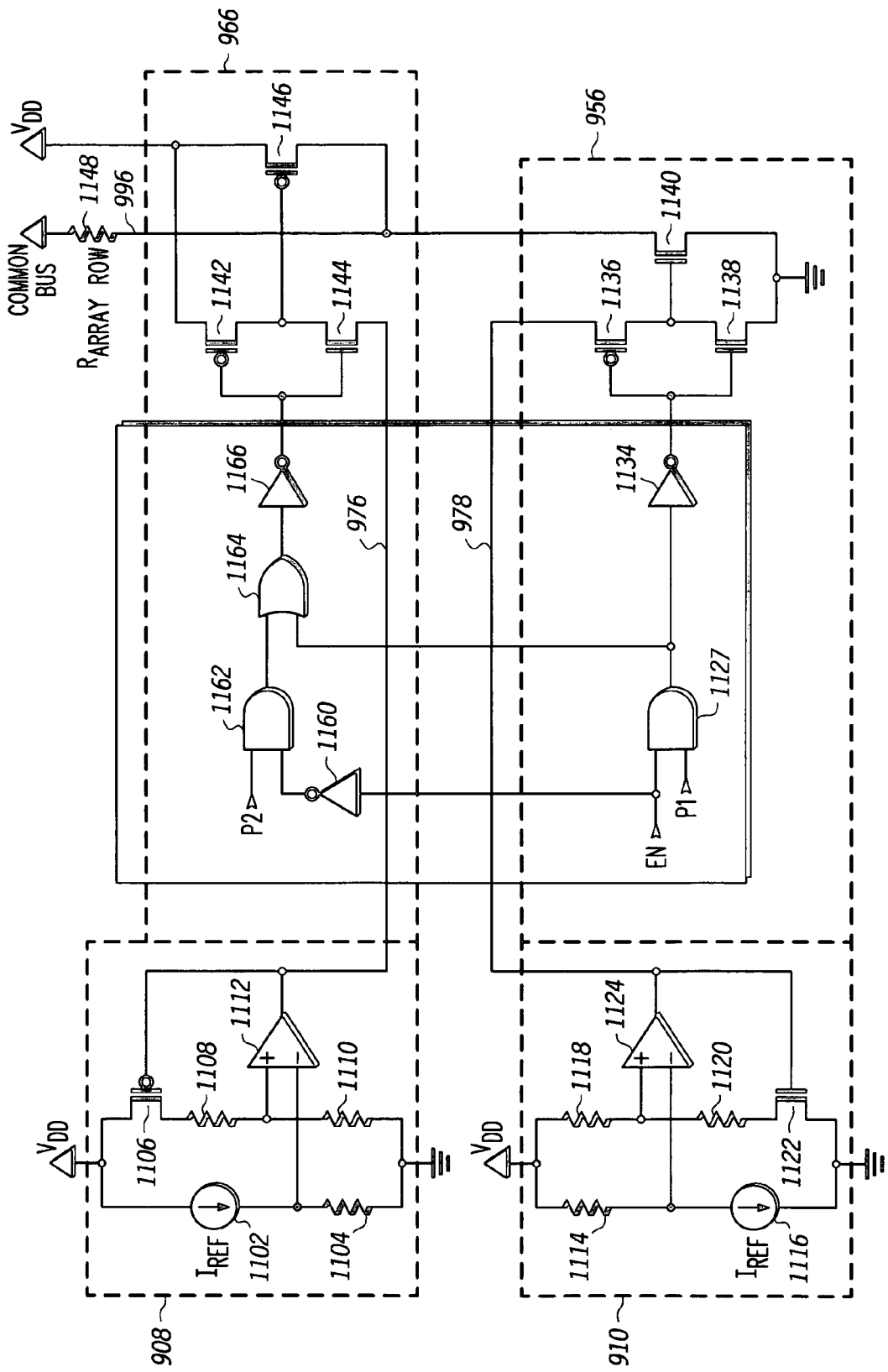
FIG. 13 illustrates in schematic form another write memory driver and associated circuitry for the MRAM architecture of FIGS. 9 and 10.

Illustrated in FIG. 13 is another form of a write memory driver for the MRAM architecture 900 of FIGS. 9 and 10. This example of a circuit implementation of a portion of MRAM architecture 900 assumes that the bus driver 980 is used. In one form the bus driver 980 has an inverter circuit (not shown) whose input is connected to the control signal P2 and whose output drives the common bus 982. When control signal P2 is inactive the bus driver 980 places $V_{DD}$ on the common bus 982, and when control signal P2 is active the bus driver 980 drives $V_{SS}$ on the common bus 982.

For purposes of brevity, in addition to the $V_{DD}$ drive bias control circuit 908, and $V_{SS}$ drive bias control circuit 910, only circuitry associated with drivers 966 and 956 is illustrated in FIG. 13. It should be understood that circuitry analogous to drivers 966 and 956 is implemented for all of the drivers within architecture 900. Further, identical reference numbers are used for elements in FIG. 13 which are common with elements in FIG. 11. In the $V_{DD}$ drive bias control circuit 908, the current source 1102 provides a reference current $I_{REF}$ and has a first terminal connected to supply voltage $V_{DD}$. A second terminal of current source 1102 is connected to both a first terminal of a resistor 1104 and to an inverting or negative input of operational amplifier 1112. A second terminal of resistor 1104 is connected to a ground reference terminal. The P-channel transistor 1106 has a source connected to the supply voltage $V_{DD}$. A gate of transistor 1106 is connected to an output of operational amplifier 1112. A drain of transistor 1106 is connected to a first terminal of a resistor 1108. A second terminal of resistor 1108 is connected to a non-inverting or positive input of operational amplifier 1112 and a first terminal of resistor 1110. A second terminal of resistor 1110 is connected to the ground reference terminal. The output of operational amplifier 1112 provides a bias voltage to bus 976.

The $V_{SS}$ drive bias control circuit 910 similarly generates a bias voltage to bus 978. A first terminal of resistor 1114 is connected to the $V_{DD}$ power supply voltage terminal. A second terminal of resistor 1114 is connected to a first terminal of a current sink 1116 for sinking a reference current $I_{REF}$. A second terminal of current sink 1116 is connected to the ground reference terminal. A first terminal of a resistor 1118 is connected to the $V_{DD}$ power supply voltage terminal. A second terminal of resistor 1114 is connected to a first terminal of a resistor 1120 and to a non-inverting or positive input of an operational amplifier 1124. An inverting or negative input of operational amplifier 1124 is connected to the second terminal of resistor 1114. A second terminal of resistor 1120 is connected to a drain of an N-channel transistor 1122. A gate of transistor 1122 is connected to the output of operational amplifier 1124. A source of transistor 1122 is connected to the ground reference terminal. The output of operational amplifier 1124 provides a bias voltage to driver 966 via bus 978.

Driver 956 has an AND gate 1127 having a first input connected to a terminal for receiving an enable signal labeled "EN". A second input of AND gate 1127 is connected to a terminal for receiving a control signal P1 of FIG. 12. An output of AND gate 1127 is connected to an input of an inverter 1134. An output of inverter 1134 is connected to a gate of a P-channel transistor 1136 and a gate of an N-channel transistor 1138. Bus 978 is connected to a source of P-channel transistor 1136. The drain of P-channel transistor 1136 is connected to a drain of N-channel transistor 1138 and to a gate of an N-channel transistor 1140. A source of N-channel transistor 1138 and a source of N-channel transistor 1140 are both connected to the ground reference terminal.

Driver 966 has an inverter 1160 having an input connected to the enable signal EN. An output of inverter 1160 is connected to a first input of an AND gate 1162. A second input of AND gate 1162 is connected to control signal P2 of FIG. 12. An output of AND gate 1162 is connected to a first input of an OR gate 1164. A second input of OR gate 1162 is connected to the output of AND gate 1128 of driver 956. An output of OR gate 1164 is connected to an input of an inverter 1166. A P-channel transistor 1142 has a source connected to the power supply voltage terminal labeled $V_{DD}$, a gate connected to a gate of an N-channel transistor 1144 and to an output of inverter 1166, and a drain connected to a drain of the N-channel transistor 1144 and a gate of a P-channel transistor 1146. A source of N-channel transistor 1144 is connected to bus 976. The P-channel transistor 1146 has a source connected to the power supply voltage terminal labeled $V_{DD}$, a gate connected to the drain of transistor 1142, and a drain connected to the drain of N-channel transistor 1140 and to the row conductor 996 for driving the row conductor 996. The MRAM memory cells 940 and 932 through 924 and 916 are collectively represented as a resistance 1148 labeled "$R_{ARRAY\ ROW}$". The row conductor 996 terminates into the common bus 982.

In operation, current source 1102 of the $V_{DD}$ drive bias control circuit 908 provides a reference current through resistor 1104. Resistor 1104 and resistor 1110 are size ratioed so that the resistance of resistor 1104 is multiple of the resistance of resistor 1110. Operational amplifier 1112 is used to bias transistor 1106 so that the voltage across resistor 1110 is the same as the voltage across resistor 1104. Therefore, resistor 1110 will conduct significantly more current than resistor 1104. The series resistance of resistors 1108 and 1110 are ratioed to the array row resistance 1148 $R_{ARRAY\ ROW}$ in the same ratio as the width of transistor 1140 is ratioed to transistor 1106. The resistor 1108 functions to control the drain voltage on transistor 1106. The bias voltage on bus 976 is also used by driver 966.

Similarly, the $V_{SS}$ drive bias control circuit 910 provides a bias voltage to bus 978 to driver 956. Since the drive bias control circuit 910 is reciprocally structured to drive bias control circuit 908, both circuits operate analogously.

Refer again to FIG. 12 which illustrates an exemplary timing control for drivers 966 and 956. At time t0 control signals P1, P2 and EN are inactive. As a result, the transistor 1146 is conductive but transistor 1140 is not conductive. Since all the drivers 951 to 958 and 961 to 968 are in the same state, no current is flowing in either of drivers 961 and 951. At time t1 control signal P1 is active, P2 is inactive and EN is active only for the selected drivers attached to the selected write line. As a result transistor 1140 is conductive and transistor 1146 is non-conductive in the selected drivers, whereas transistor 1146 is conductive and transistor 1140 is non-conductive in the unselected drivers. Therefore, bias voltage on bus 978 is applied to the gate of transistor 1140 in the selected driver making it conductive. In addition, the gate of transistor 1146 is connected to bus 976 for all the unselected drivers making them conductive as well. Optionally, the bus driver circuit 980 connected to the common bus 982 places the $V_{DD}$ potential on the common bus 982. The application of the voltage on bus 978 to the gate of transistor 1140 results in a current of predetermined magnitude $I_0$ controlled by the bias voltage on bus 978 flowing through the selected write line and a small negative current of $-I_0/(N-1)$ or no current flow if the optional bus driver circuit 980 is used in the unselected write lines. The number "N" must be large enough for $I_0/(N-1)$ to be small when compared to $I_1$ or the optional bus driver circuit 980 must be used.

At time t3 control signal P2 is active, control signal P1 is inactive and the enable signal EN is active only for the selected drivers attached to the selected write line. As a result transistors 1144 and 1138 are conductive and transistors 1142 and 1136 are non-conductive in the selected drivers. Transistors 1142 and 1136 are conductive and transistors 1144 and 1138 are non-conductive in the unselected drivers. Therefore, a bias voltage on bus 976 is applied to the gate of transistor 1146 in the selected driver making it conductive. Optionally, the bus driver circuit 980 is connected to the common bus 982 and places a $V_{SS}$ potential on the common bus 982. This voltage results in a current of predetermined magnitude I1 controlled by the bias voltage on bus 976 flowing through the selected write line in a direction opposite to the current flowing at time t1.

At time t4 control signals P1, P2 and EN are again inactive. As a result, the transistor 1146 is conductive but transistor 1140 is not conductive. No current is flowing in either of drivers 961 and 951 attached to both selected and unselected write lines.

Figure 14:
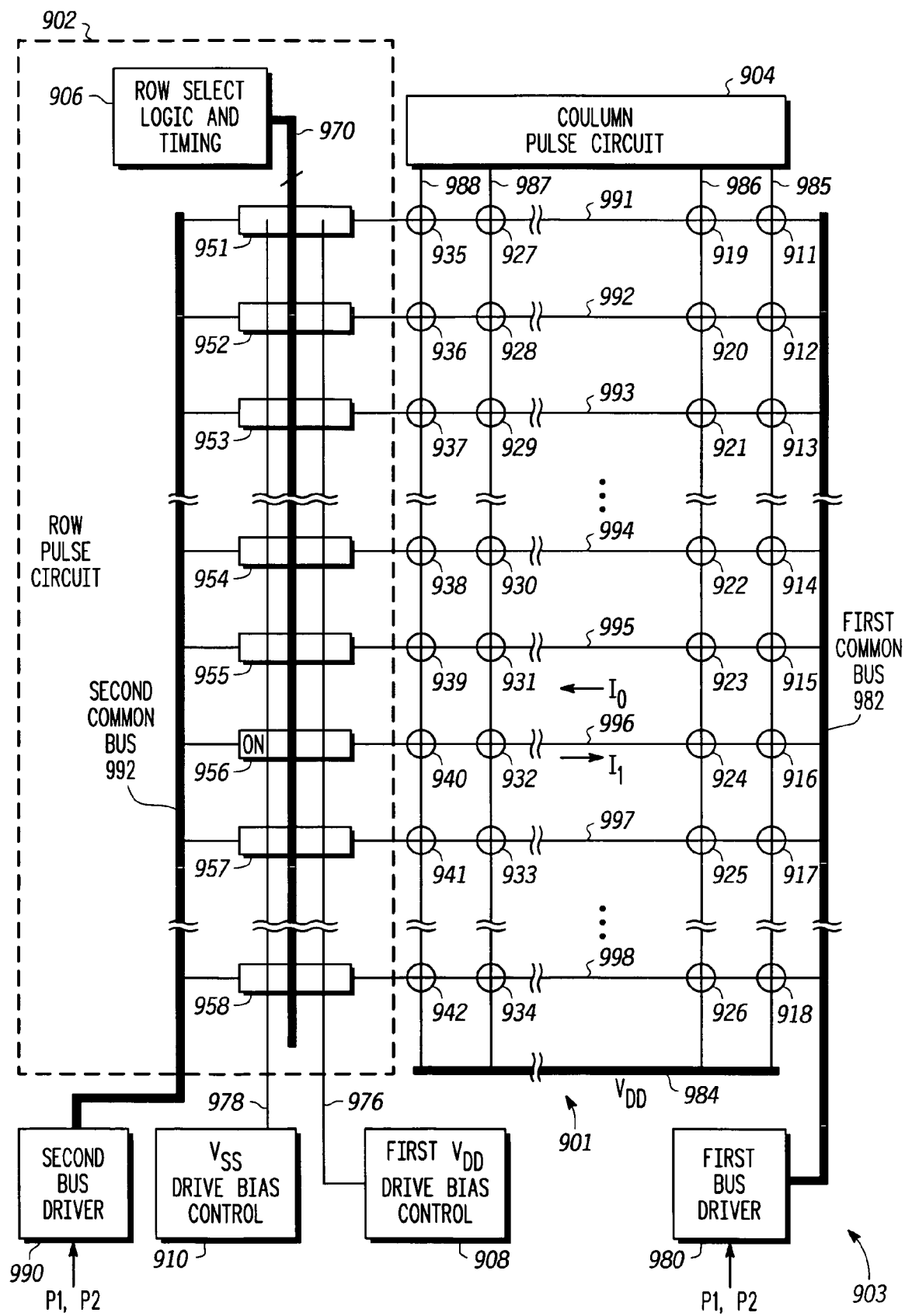
FIG. 14 illustrates a write portion of another exemplary MRAM architecture in accordance with the present invention.

Illustrated in FIG. 14 is another form of an MRAM architecture. MRAM architecture 903 is illustrated for a memory write operation and utilizes two common buses that can be connected to either $V_{DD}$ or $V_{SS}$ through separate bus drivers. For convenience of comparison with the MRAM architecture of FIGS. 9 and 10, common elements between MRAM architecture 900 and MRAM architecture 903 are numbered identically. The MRAM architecture 903 has column pulse circuit 904, row select logic and timing circuit 906, a $V_{DD}$ drive bias control circuit 908 and a $V_{SS}$ drive bias control circuit 910. As with MRAM architecture 900, the plurality of memory cells 911 through 942 form a memory array. Each of memory cells 911–942 is formed at the intersection of a respective one of a plurality of column conductors 985, 986 . . . 987 and 988 and a respective one of a plurality of row conductors 991–997 and up to row conductor 998. Each of memory cells 911–942 is a magnetoresistive random access memory cell. Each column conductor functions as a write bit line and each row conductor functions as a write word line. It should be appreciated that any number of row conductors and column conductors may be implemented. Also, the total number of row conductors may or may not equal the total number of column conductors. Each of row conductors 991–998 is connected to a first common bus 982 on one end and to a respective one of drivers 951–958. Each of the column conductors 985–988 has a first end that is connected to the column pulse circuit 904 and has a second end that is connected to a $V_{DD}$ power bus 984. Each of drivers 951–958 is connected to a $V_{DD}$ bias on bus 976 and to a $V_{SS}$ bias on bus 978. An input of each of drivers 951–958 is connected to a common bus 992 and an output of drivers 951–958 is connected to row conductors 991–998, respectively. The $V_{DD}$ drive bias control circuit 908 is connected to the $V_{DD}$ bias on bus 976, and the $V_{SS}$ drive bias control circuit 910 is connected to the $V_{SS}$ bias on bus 978. A first bus driver circuit 980 is connected to the common bus 982. Control signal P2 of FIG. 12 is connected to the bus driver circuit 980. A second bus driver circuit 990 is connected to the second common bus 992 and receives the control signal P2 of FIG. 12. Collectively the row select logic and timing circuit 906, the bus 976, the bus 978, drivers 951–958 and the second common bus 992 form a row pulse circuit 902.

In the illustrated form, each of drivers 951–955 and drivers 957 and 958 are "off" or disabled by the row select logic and timing circuit 906 and do not permit any current to be conducted by row conductors 991–995 and 997–998. Driver 956 is biased to be "on" or conductive by row select logic and timing circuit 906. Depending on the values of control signals P1 and P2 in FIG. 12, one of two currents, $I_0$ and $I_1$ may be made to flow in row conductor 996. Current $I_0$ flows in row conductor 996 away from the first common bus 982 and into the second common bus 992 via driver 956 when P1 is asserted. Current $I_1$ flows in row conductor 996 away from the second common bus 992 and into the first common bus 982 when P2 is asserted.

The circuit operation of MRAM architecture 903 of FIG. 14 will now be described in connection with the timing illustrated in FIG. 12. Assume that an instruction decode operation instructs a write operation to occur at the bit located at memory cell 924. At time t1, a magnetic field $H_y$ of magnitude $H_{y0}$ is present. The magnetic field $H_y$ of magnitude $H_{y0}$ is generated by flowing current through the write word line of row conductor 996. To generate the magnetic field $H_y$ of magnitude $H_{y0}$, current of magnitude $I_0$ flows from the $V_{DD}$ power bus through the first bus driver circuit 980 and the first common bus 982, through the write word line of row conductor 996 and the driver 956 to the second common bus 992 producing magnetic field $H_y$ of magnitude $H_{y0}$ at the selected bit 924. To produce magnetic field $H_y$ of magnitude $H_{y0}$ at the selected bit 924, driver 956 is made conductive under the control of signals on bus 970 generated by the row select logic and timing circuit 906. Also, under the control of the timing signals from circuit 906, the first bus driver circuit 980 places a $V_{DD}$ potential on the first common bus 982, and the second bus driver 990 connects the second common bus 992 to $V_{SS}$. The conductive driver 956 is controlled by the bias voltage conducted via the bus 978. The biasing of driver 956 determines the magnitude of current $I_0$ through the write word line of row conductor 996.

In addition, at time t2 a magnetic field $H_x$ of magnitude $H_{x0}$ is present. The magnetic field $H_x$ of magnitude $H_{x0}$ is generated by flowing current through the write bit line of column conductor 986 under the control of the column pulse circuit 904 from the $V_{DD}$ power bus 984. In the illustrated form bidirectional current is allowed to flow on the write word lines (i.e. the row conductors) but not the write bit lines (i.e. the column conductors). However, it should be understood that in other implementations, bidirectional current may be allowed to flow on the write bit lines but not the write word lines in order to compensate for residual magnetic fields. Also, bidirectional current may be allowed to flow on both the write bit lines and the write word lines for the compensation of residual magnetic fields.

At time t3, currents continue to flow through the write bit line of the column conductor 986 as described previously for time t2. In addition, magnetic field $H_y$ of magnitude $H_{y1}$ needs to be generated by flowing current through the write word line of row conductor 996. To do this, a current of magnitude $I_1$ flows from $V_{DD}$ and through the second bus driver 990, the second common bus 992, driver 956 and the write word line of row conductor 996, to the first common bus 982 and through the first bus driver circuit 980 to $V_{SS}$. The magnitude of the current $I_1$ is controlled by the $V_{DD}$ drive bias control circuit 908 output voltage on the bus 976 through the conductive driver 956. The current $I_1$ flows in a direction opposite to current $I_0$ and its magnitude generates field $H_{y1}$ in the direction opposite to $H_{y0}$ at the selected bit of memory cell 924.

At time t4 of FIG. 8 the driver 956 is disabled to turn off the write word line current within row conductor 996. No current is therefore conducted in any of the row conductors 991–997 and 998. Similarly, the column pulse circuit 904 turns off the write bit line currents within the column conductors as required. Thus the MRAM architecture 900 is another exemplary architecture that implements the timing diagram of FIG. 12.

Figure 15:
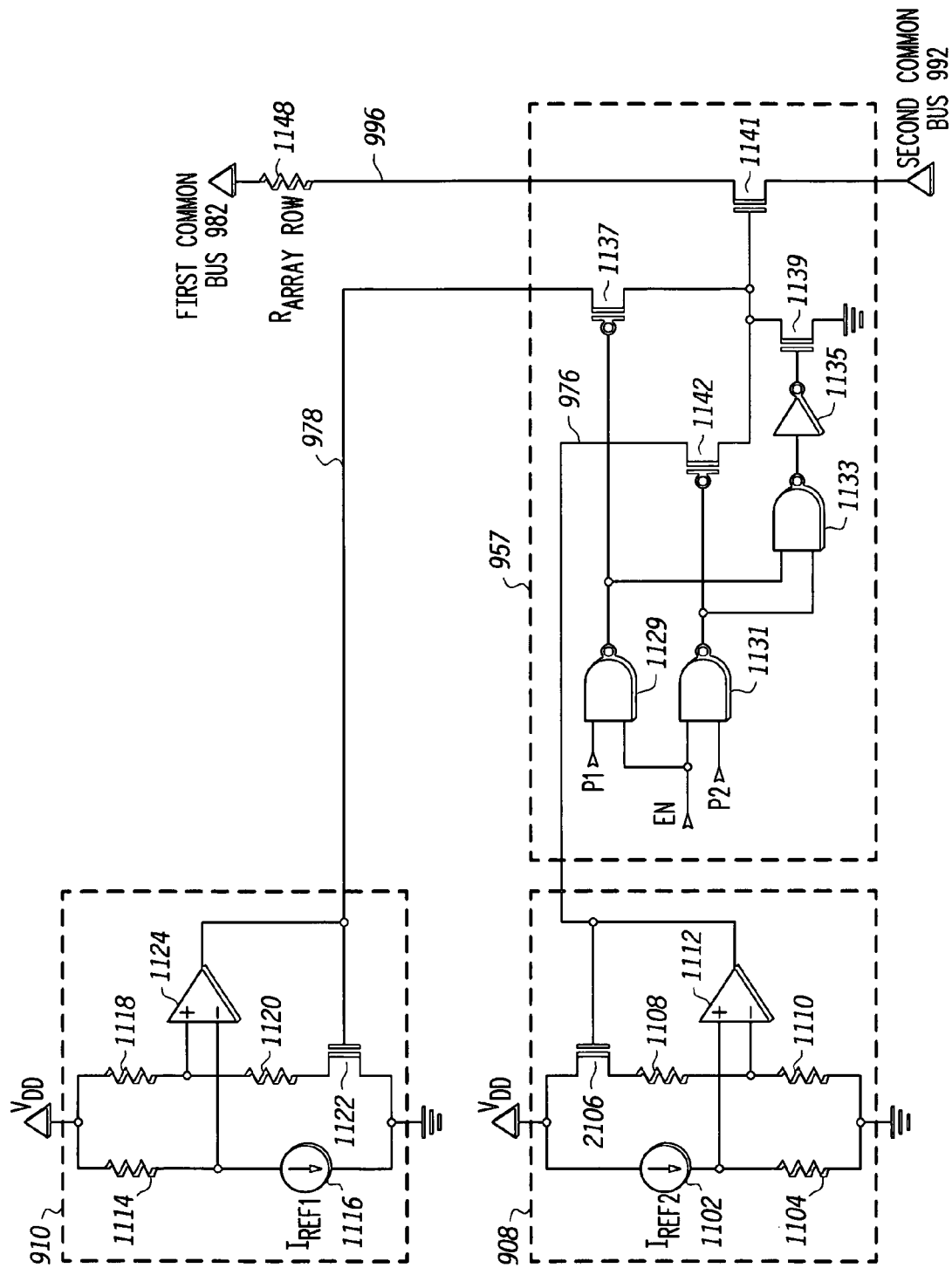
FIG. 15 illustrates in schematic form a memory write driver and associated circuitry for the MRAM architecture of FIG. 14.

Illustrated in FIG. 15 is an exemplary schematic of a portion of the circuitry associated with MRAM architecture 903. For purposes of brevity, along with $V_{SS}$ drive bias control circuit 910 and $V_{DD}$ drive bias control circuit 908, only circuitry associated with the driver 956 is illustrated since driver 956 was the selected conductive driver in the immediately preceding discussion. It should be understood that analogous circuitry is implemented for all of the drivers within MRAM architecture 903. Reference numbers and signals for elements that are also common to FIGS. 11, 12, 13 and 14 are intentionally repeated in FIG. 15.

The $V_{SS}$ drive bias control circuit 910 generates a bias voltage to bus 978. A first terminal of a resistor 1114 is connected to the $V_{DD}$ power supply voltage terminal. A second terminal of resistor 1114 is connected to a first terminal of a current sink 1116 for sinking a first reference current $I_{REF\ 1}$. A second terminal of current sink 1116 is connected to the ground reference terminal. A first terminal of a resistor 1118 is connected to the $V_{DD}$ power supply voltage terminal. A second terminal of resistor 1118 is connected to a first terminal of a resistor 1120 and to a non-inverting or positive input of an operational amplifier 1124. An inverting or negative input of operational amplifier 1124 is connected to the second terminal of resistor 1114. A second terminal of resistor 1120 is connected to a drain of an N-channel transistor 1122. A gate of transistor 1122 is connected to the output of operational amplifier 1124. A source of transistor 1122 is connected to the ground reference terminal. The output of operational amplifier 1124 provides a bias voltage via bus 978.

In the $V_{DD}$ drive bias control circuit 908, a current source 1102 provides a second reference current $I_{REF\ 2}$ and has a first terminal connected to supply voltage $V_{DD}$. A second terminal of current source 1102 is connected to both a first terminal of a resistor 1104 and to a non-inverting input or positive input of an operational amplifier 1112. A second terminal of resistor 1104 is connected to a ground reference terminal. An N-channel transistor 2106 has a drain connected to the supply voltage $V_{DD}$. A gate of transistor 2106 is connected to an output of operational amplifier 1112 and to a bus 976. A source of transistor 2106 is connected to a first terminal of a resistor 1108. A second terminal of resistor 1108 is connected to an inverting or negative input of operational amplifier 1112. The output of operational amplifier 1112 provides a bias voltage to bus 976. A second terminal of resistor 1110 is connected to the ground reference terminal.

Driver 957 has an AND gate 1129 having a first input connected to a terminal for receiving a predetermined enable signal EN and having a second input connected to a terminal for receiving control signal P1 of FIG. 12. An output of AND gate 1129 is connected to a gate of a P-channel transistor 1137 and to a first input of a NAND gate 1133. A NAND gate 1131 has a first input connected to the terminal for receiving the predetermined enable signal EN and has a second input for receiving control signal P2 of FIG. 12. An output of NAND gate 1131 is connected to a gate of P-channel transistor 1142 and to a second input of NAND gate 1133. An output of NAND gate 1133 is connected to an input of inverter 1135. An output of inverter 1135 is connected to a gate of an N-channel transistor 1139. A source of N-channel transistor 1139 is connected to the ground reference terminal. A drain of N-channel transistor 1139 is connected to a drain of transistor 1142. A source of transistor 1142 is connected to bus 976. A source of P-channel transistor 1137 is connected to bus 978, and a drain of P-channel transistor 1137 is connected to a drain of P-channel transistor 1142 and to a gate of an N-channel transistor 1141. A source of N-channel transistor 1141 is connected to the second common bus 992. The driver 956 is connected to the memory cells of row conductor 996. The collective resistance of the memory cells of row conductor 996 is represented by a resistance 1148 labeled $R_{ARRAY\ ROW}$ that is connected to the drain of N-channel transistor 1141. The resistance 1148 $R_{ARRAY\ ROW}$ is connected to the first common bus 982.

In operation, the current source 1102 provides a reference current to resistor 1104. Resistor 1104 and resistor 1110 are size ratioed so that the resistance of resistor 1104 is a multiple of the resistance of resistor 1110. Operational amplifier 1112 is used to bias transistor 2106 so that the voltage across resistor 1110 is the same as the voltage across resistor 1104. Therefore, resistor 1110 will conduct significantly more current than resistor 1104. The series resistance of resistors 1108 and 1110 is ratioed to the array row resistance 1148 $R_{ARRAY\ ROW}$ in the same ratio as the width of transistor 1140 is ratioed to the width of transistor 2106. When operational amplifier 1112 adjusts the gate voltage of transistor 2106 to have the correct current and when the gate of transistor 1140 is biased by the same amount, then row 996 will have a current that ratios to the current in resistors 1108 and 1110 as the ratio of the resistances and transistor widths. The bias voltage generated on bus 976 is used by driver 956 in addition to the other drivers of FIG. 14.

Drive bias control circuit 910 also provides a bias voltage on bus 978 to driver 956 in a fashion similar to that explained in FIG. 11. The bias voltage is connected to the source of P-channel transistor 1136 and passed on to the gate of transistor 1140 when transistor 1138 is conductive.

The exemplary timing control illustrated in FIG. 12 also applies to the implementation of driver 956 in FIG. 15. At time t0 control signals P1, P2 and EN are inactive. As a result, the transistor 1140 is not conductive and no current is flowing in driver 956.

At times t1 and t2, control signal P1 is active, P2 is inactive and EN is active only for the selected driver attached to the selected write line. As a result, transistor 1141 is conductive in the selected driver, whereas transistor 1141 is non-conductive in the unselected drivers. The bias voltage on bus 978 is applied to the gate of transistor 1141 in the selected driver making it conductive. The first bus driver circuit 980 that is connected to the first common bus 982 places a $V_{DD}$ potential on the first common bus 982. The second bus driver 990 that is connected to the second common bus 992 places a $V_{SS}$ potential on the second common bus 992. This biasing creates a current of predetermined magnitude $I_0$ controlled by the bias voltage of bus 976 to flow through the selected write line row conductor and no current to flow in the unselected write lines.

At time t3 control signal P2 is active, control signal P1 is inactive and control signal EN is active only for the selected drivers attached to the selected write line. As a result, transistor 1141 is conductive in the selected driver, whereas transistor 1141 is non-conductive in the unselected drivers. The bias voltage on bus 976 is applied to the gate of transistor 1141 in the selected driver making it conductive. The first bus driver circuit 980 connected to the first common bus 982 places a $V_{SS}$ potential on the first common bus 982. The second bus driver 990 connected to the second common bus 992 places a $V_{DD}$ potential on the second common bus 992. This biasing results in a current of predetermined magnitude $I_1$ controlled by the bias voltage on bus 976 to flow through the selected write bit line row conductor in a direction opposite to the current flowing at time t1.

At time t4 control signals P1, P2 and EN are again inactive. As a result, the transistor 1141 is not conductive. No current therefore flows in the drivers that are attached to both selected and unselected write line row conductors.

By now it should be apparent that there has been provided an MRAM having an architecture with control logic and voltage control to drive currents in alternating directions in a selected write bit line to terminate any residual magnetization in the write bit line. It is believed that the cladding of the write bit line and possibly other elements may cause residual magnetization to exist in an MRAM write bit line. By driving write bit line currents in alternating direction, the residual magnetization is reduced to a point that erroneous operation is removed.

In one form there is herein provided a method of writing a memory cell of an MRAM. A first magnetic field is applied to a memory cell during a first time period, the first magnetic field having a first direction and a first magnitude. A second magnetic field is applied to the memory cell during a second time period, the second magnetic field having a second direction and a second magnitude, wherein a start of the second time period follows a start of the first time period. An end of the second time period follows an end of the first time period, and the first time period overlaps the second time period. A third magnetic field is applied to the memory cell during a third time period, wherein the third time period overlaps at least a portion of the second time period, the third magnetic field having a third direction and a third magnitude. A start of the third time period follows the end of the first time period. The third direction of the third magnetic field is approximately opposite to the first direction of the first magnetic field.

In one form the magnitude of the second magnetic field is greater than the magnitude of the third magnetic field. In another form the magnitude of the first magnetic field is greater than the magnitude of the third magnetic field. In one form an end of the third time period is at or before the end of the second time period. In yet another form an end of the third time period is after the end of the second time period. In one form the first magnetic field and the third magnetic field are applied by passing current through a same first conductor in the memory cell. The second magnetic field is applied by passing current through a second conductor in the memory cell, wherein the second conductor is different than the first conductor. In another form the third magnitude of the third magnetic field is approximately equal to or greater than a magnitude of a residual magnetic field. In yet another form the first magnetic field is applied by passing a first current through a first conductor in the memory cell in a first direction at a first current level. The second magnetic field is applied by passing a second current through a second conductor in the memory cell in a second direction at a second current level. The third magnetic field is applied by passing a third current through the first conductor in the memory cell in a third direction at a third current level. In this form the third direction is opposite the first direction.

In another form an MRAM comprises an MRAM array comprising a plurality of MRAM cells. The MRAM comprises write circuitry for writing a memory cell of the plurality of MRAM cells, wherein the write circuitry comprises a first driver, such as driver 956, coupled to the memory cell for passing a first current through a first current path of the memory cell. A second driver, contained within column pulse circuit 904 and analogous to each of drivers 951–958, is coupled to the memory cell and passes a second current through a second current path of the memory cell. To avoid repetitive detail, the column drivers and control circuitry of column pulse circuitry 904 is not repeated but is analogous to the drivers and bias control circuits illustrated for the rows. A third driver, such as driver 966, is coupled to the memory cell for passing a third current through the first current path, wherein the third current flows in an opposite direction relative to the first current. Control circuitry enables the first driver during a first time period, and enables both the first driver and the second driver during a second time period and a third time period, wherein at least a portion of the third time period overlaps with the second time period. In one form a start of the first time period is before a start of the second time period, an end of the first time period is before an end of the second time period, the second time period overlaps the first time period, and a start of the third time period is after the end of the first time period.

In another form the MRAM further comprises a first bias circuit coupled to the first driver, the first bias circuit controlling a magnitude of the first current. A second bias circuit is coupled to the third driver and controls a magnitude of the third current. In one form the first driver comprises a first transistor of a first conductivity type for providing the first current, and the third driver comprises a second transistor of a second conductivity type for providing the third current. In one form the first conductivity type of transistor comprises n-channel and the second conductivity type of transistor comprises p-channel.

In yet another form an MRAM comprises an MRAM array comprising a plurality of MRAM cells. The MRAM also comprises write circuitry for writing a memory cell of the plurality of MRAM cells, wherein the write circuitry comprises a first driver coupled to the memory cell for passing a first current through a first current path of the memory cell, and a second driver coupled to the memory cell that passes a second current through a second current path of the memory cell. The first driver also passes a third current through the first current path in an opposite direction relative to the first current. Control circuitry enables the first driver during a first time period, and enables the second driver during a second time period and the first driver during a third time period, wherein at least a portion of the third time period overlaps with the second time period.

In one form a start of the first time period is before a start of the second time period, an end of the first time period is before an end of the second time period, the second time period overlaps the first time period, and a start of the third time period is after the end of the first time period. In one form the MRAM further comprises a first bias circuit, coupled to the first driver, the first bias circuit controlling a magnitude of the first current and a second bias circuit, coupled to the first driver, the second bias circuit controlling a magnitude of the third current.

In yet another form there is herein provided a storage circuit comprising a first current conductor, a second current conductor oriented orthogonal to the first current conductor and a magnetic tunnel junction situated between the first current conductor and the second current conductor. A first current having a first direction is provided in the first current conductor during a first time period, and a second current having a second direction is provided in the second current conductor during a second time period. A third current having a third direction which is opposite the first direction is provided in the first current conductor during at least a portion of the second time period. In one form a magnitude of the second current is greater than a magnitude of the third current, and the magnitude of the first current is greater than a magnitude of the third current. In another form a start of the first time period is before a start of the second time period, an end of the first time period is before an end of the second time period, and the second time period overlaps the first time period. The storage circuit is implemented in an integrated circuit.

In yet another form there is provided an MRAM in which a magnetic field analogous to 104 of FIG. 8, for example, is bipolar and a magnetic field analogous to 802 is not. In this form modified from FIG. 8 magnetic field 804 first transitions between t0 and t1 and is present until between t2 and t3. Magnetic field 104 initially is present in one direction at time t1 and switches to an opposite direction between time t3 and time t4. At time t2 both magnetic fields 802 and 104 would be present. However, in this form magnetic field 802 may or may not also transition to an opposite direction depending upon whether correction of residual magnetization in two different axes is desired.

In this alternate bipolar form, there is an MRAM array with a plurality of MRAM cells. Write circuitry writes a memory cell of the plurality of MRAM cells. The write circuitry has a first driver coupled to the memory cell for passing a first current through a first current path of the memory cell. A second driver of the write circuitry is coupled to the memory cell that passes a second current through a second current path of the memory cell. A third driver is coupled to the memory cell for passing a third current through the second current path. The third current flows in an opposite direction relative to the second current. Control circuitry enables the first driver during a first time period, and enables both the first driver and the second driver during a second time period and the third driver during a third time period.

Various changes and modifications to the embodiments herein chosen for purposes of illustration will readily occur to those skilled in the art. For example, although a toggle programming MRAM is discussed for some applications, it should be apparent that other types of memory cells may utilize the features disclosed herein. Variations in the types of conductivities of transistors, the types of transistors, etc. may be readily made. Although data storage circuits have been described throughout in the context of an MRAM, the disclosed embodiments may be used in any context in which a data storage circuit is desired such as for embedded memory, storage registers, shift registers, flip-flops, fuses, antifuses, etc. Although specific logic circuits have been shown, numerous logic circuit implementations may be used to implement the functions discussed herein. To the extent that such modifications and variations do not depart from the spirit of the invention, they are intended to be included within the scope thereof which is assessed only by a fair interpretation of the following claims.

The invention claimed is:

1. A method of writing a memory cell of an MRAM, comprising:
    applying a first magnetic field to a memory cell during a first time period, the first magnetic field having a first direction and a first magnitude;
    applying a second magnetic field to the memory cell during a second time period, the second magnetic field having a second direction and a second magnitude, wherein a start of the second time period follows a start of the first time period; wherein an end of the second time period follows an end of the first time period, and wherein the first time period overlaps the second time period; and
    applying a third magnetic field to the memory cell during a third time period, wherein the third time period overlaps at least a portion of the second time period, the third magnetic field having a third direction and a third magnitude,
    wherein a start of the third time period follows the end of the first time period, and
    wherein the third direction of the third magnetic field is approximately opposite to the first direction of the first magnetic field.

2. A method as in claim 1, wherein the second magnitude of the second magnetic field is greater than the third magnitude of the third magnetic field.

3. A method as in claim 1, wherein the first magnitude of the first magnetic field is greater than the third magnitude of the third magnetic field.

4. A method as in claim 1, wherein an end of the third time period is at or before the end of the second time period.

5. A method as in claim 1, wherein an end of the third time period is after the end of the second time period.

6. A method as in claim 1, wherein applying the first magnetic field and applying the third magnetic field further comprise passing current through a same first conductor in the memory cell, and applying the second magnetic field further comprises passing current through a second conductor in the memory cell, wherein the second conductor is different than the first conductor.

7. A method as in claim 1, wherein the third magnitude of the third magnetic field is approximately equal to or greater than a magnitude of a residual magnetic field.

8. A method as in claim 1, wherein,
    the applying the first magnetic field comprises passing a first current through a first conductor in the memory cell in a first direction at a first current level,
    the applying the second magnetic field comprises passing a second current through a second conductor in the memory cell in a second direction at a second current level, and
    the applying the third magnetic field comprises passing a third current through the first conductor in the memory cell in a third direction at a third current level,
    wherein the third direction is opposite the first direction.

9. An MRAM, comprising:
    an MRAM array comprising a plurality of MRAM cells; and
    write circuitry for writing a memory cell of the plurality of MRAM cells,
    wherein the write circuitry comprises:
        a first driver coupled to the memory cell for passing a first current through a first current path of the memory cell;
        a second driver coupled to the memory cell that passes a second current through a second current path of the memory cell;
        a third driver coupled to the memory cell for passing a third current through the first current path,
        wherein the third current flows in an opposite direction relative to the first current; and
        control circuitry that enables the first driver during a first time period, and that enables both the first driver and the second driver during a second time period and the third driver during a third time period, wherein at least a portion of the third time period overlaps with the second time period.

10. An MRAM as in claim 9, wherein a start of the first time period is before a start of the second time period, an end of the first time period is before an end of the second time period, the second time period overlaps the first time period, and a start of the third time period is after the end of the first time period.

11. An MRAM as in claim 9, further comprising:
    a first bias circuit, coupled to the first driver, the first bias circuit controlling a magnitude of the first current; and
    a second bias circuit, coupled to the third driver, the second bias circuit controlling a magnitude of the third current.

12. An MRAM as in claim 9, wherein the first driver comprises a first transistor of a first conductivity type for providing the first current, and wherein the third driver comprises a second transistor of a second conductivity type for providing the third current.

13. An MRAM as in claim 12, wherein the first conductivity type of the first transistor comprises n-channel and the second conductivity type of the second transistor comprises p-channel.

14. An MRAM, comprising:
an MRAM array comprising a plurality of MRAM cells; and
write circuitry for writing a memory cell of the plurality of MRAM cells,
wherein the write circuitry comprises:
- a first driver coupled to the memory cell for passing a first current through a first current path of the memory cell;
- a second driver coupled to the memory cell that passes a second current through a second current path of the memory cell;
- wherein the first driver also passes a third current through the first current path in an opposite direction relative to the first current; and
- control circuitry that enables the first driver during a first time period, that enables the second driver during a second time period and the first driver during a third time period, wherein at least a portion of the third time period overlaps with the second time period.

15. An MRAM as in claim 14, wherein a start of the first time period is before a start of the second time period, an end of the first time period is before an end of the second time period, the second time period overlaps the first time period, and a start of the third time period is after the end of the first time period.

16. An MRAM as in claim 14, further comprising:
a first bias circuit, coupled to the first driver, the first bias circuit controlling a magnitude of the first current; and
a second bias circuit, coupled to the first driver, the second bias circuit controlling a magnitude of the third current.

17. A storage circuit, comprising:
a first current conductor;
a second current conductor oriented orthogonal to the first current conductor;
a magnetic tunnel junction situated between the first current conductor and the second current conductor; wherein a first current having a first direction is provided in the first current conductor during a first time period, and wherein a second current having a second direction is provided in the second current conductor during a second time period, and
wherein a third current having a third direction which is opposite the first direction is provided in the first current conductor during at least a portion of the second time period.

18. A storage circuit as in claim 17, wherein a magnitude of the second current is greater than a magnitude of the third current, and wherein the magnitude of the first current is greater than a magnitude of the third current.

19. A storage circuit as in claim 17, wherein a start of the first time period is before a start of the second time period, an end of the first time period is before an end of the second time period, and the second time period overlaps the first time period.

20. An MRAM, comprising:
an MRAM array comprising a plurality of MRAM cells; and
write circuitry for writing a memory cell of the plurality of MRAM cells,
wherein the write circuitry comprises:
- a first driver coupled to the memory cell for passing a first current through a first current path of the memory cell;
- a second driver coupled to the memory cell that passes a second current through a second current path of the memory cell;
- a third driver coupled to the memory cell for passing a third current through the second current path,
- wherein the third current flows in an opposite direction relative to the second current; and
- control circuitry that enables the first driver during a first time period, and that enables at least one of the first driver and the second driver during a second time period and the third driver during a third time period.

* * * * *